United States Patent
Zaitsu et al.

(10) Patent No.: US 8,873,287 B2
(45) Date of Patent: Oct. 28, 2014

(54) NONVOLATILE PROGRAMMABLE LOGIC SWITCH

(75) Inventors: Koichiro Zaitsu, Kawasaki (JP);
Kosuke Tatsumura, Kawasaki (JP);
Mari Matsumoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 145 days.

(21) Appl. No.: 13/606,166

(22) Filed: Sep. 7, 2012

(65) Prior Publication Data

US 2013/0076392 A1 Mar. 28, 2013

(30) Foreign Application Priority Data

Sep. 22, 2011 (JP) .................................. 2011-207606

(51) Int. Cl.
*G11C 16/12* (2006.01)
*H03K 19/173* (2006.01)
*H03K 19/177* (2006.01)
*H03K 19/094* (2006.01)

(52) U.S. Cl.
CPC ........ *H03K 19/094* (2013.01); *H03K 19/17728* (2013.01)
USPC ................. 365/185.05; 365/188; 365/189.02; 365/230.02; 326/41; 326/38; 326/39

(58) Field of Classification Search
USPC ......... 326/38–41; 365/185.01, 185.05, 185.1, 365/185.17, 185.18, 185.29
See application file for complete search history.

(56) References Cited

U.S. PATENT DOCUMENTS

| | | | | |
|---|---|---|---|---|
| 5,812,450 | A * | 9/1998 | Sansbury et al. | 365/185.01 |
| 6,002,610 | A * | 12/1999 | Cong et al. | 365/185.05 |
| 6,144,580 | A * | 11/2000 | Murray | 365/185.01 |
| 6,356,478 | B1 * | 3/2002 | McCollum | 365/185.01 |
| 7,283,401 | B2 * | 10/2007 | Lee et al. | 365/185.29 |
| 7,430,137 | B2 * | 9/2008 | Greene et al. | 365/185.05 |
| 8,553,464 | B2 * | 10/2013 | Nishi et al. | 365/185.27 |
| 2008/0101117 | A1 | 5/2008 | Ogura et al. | |

OTHER PUBLICATIONS

Sze, S. M. et al., "Avalanche Breakdown Voltages of Abrupt and Linearly Graded p-n Junctions in Ge, Si, GaAs, And GaP," Applied Physics Letters, vol. 8, No. 5, pp. 111-113, (Mar. 1, 1966).

* cited by examiner

*Primary Examiner* — Vibol Tan
(74) *Attorney, Agent, or Firm* — Finnegan, Henderson, Farabow, Garrett & Dunner, L.L.P.

(57) ABSTRACT

A nonvolatile programmable logic switch according to an embodiment includes first and second cells, each of the first and second cells including: a first memory having a first to third terminals, the third terminal being receiving a control signal; a first transistor connected at one of source/drain to the second terminal; and a second transistor connected at a gate to the other of the source/drain of the first transistor, the third terminal of the first memory in the first cell and the third terminal of the first memory in the second cell being connected in common. When conducting writing into the first memory in the first cell, the third terminal is connected to a write power supply generating a write voltage, the first terminals in the first and second cells are connected to a ground power supply and a write inhibit power supply generating a write inhibit voltage respectively.

22 Claims, 23 Drawing Sheets

NONVOLATILE PROGRAMMABLE LOGIC SWITCH

CROSS-REFERENCE TO RELATED APPLICATION

This application is based upon and claims the benefit of priority from prior Japanese Patent Application No. 2011-207606 filed on Sep. 22, 2011 in Japan, the entire contents of which are incorporated herein by reference.

FIELD

Embodiments described herein relate generally to a nonvolatile programmable logic switch.

BACKGROUND

A programmable logic switch is an element which controls on/off of a logic switch (for example, a transistor or the like) in accordance with data retained in a memory. In general, the programmable logic switch is used in programmable logic devices such as an FPGA (Field Programmable Gate Array) or the like in which a logic operational circuit or an interconnection circuit needs to be reconfigured. For example, such programmable logic device includes plural wirings and a connection unit (plural connection units) for switching connection/disconnection of these wirings. The programmable logic switches may be used in such connection unit.

In a programmable logic switch used in the FPGA, a volatile memory such as an SRAM is used as a memory. If the power supply is turned off, therefore, data stored in the memory is lost. Therefore, there is a problem that data must be read anew from a memory region provided separately when the power supply is turned on again. Furthermore, in general, the SRAM is formed of six transistors. Therefore, there is a problem that the area of the chip becomes large in an FPGA which uses a large number of SRAMs.

Schemes using a nonvolatile flash memory as a memory in the programmable logic switch are known. In one of the schemes, one cell in the programmable logic switch is formed of two nonvolatile memory transistors and one switching transistor (pass transistor). As the memory transistors, for example, flash memory transistors are used. A power supply voltage or 0 V is input to the switching transistor at its gate via one of the two flash memory transistors. When it is desired to write data into the memory, a write voltage is applied to a flash memory transistor at its gate. In general, the write voltage is approximately 20 V. At this time, 0 V is applied to the memory transistor at its source. The writing utilizes the principle called FN (Fowler-Nordheim) tunnel current, and the writing is said to be advantageous in shrinking the sizes of the memory transistors. In the case where the programmable logic switch is disposed in an array form, a plurality of memory transistors share a gate. For implementing selective writing, a write inhibit voltage must be applied to a source of a memory transistor in an unselected cell. At this time, a conductive channel is formed in the memory transistor in the unselected cell, and the write inhibit voltage is unwillingly applied to a gate of the memory transistor in the unselected cell. In general, approximately 5 V is needed as the write inhibit voltage. On the other hand, it is desirable to make a gate insulation film of the switching transistor as thin as approximately several nm in order to obtain high driving force. Therefore, there is a fear that the gate insulation film might be broken down by the write inhibit voltage. If the gate insulation film of the switching transistor is made sufficiently thick, it is possible to prevent breakdown caused by the write inhibit voltage. However, the driving force of the switching transistor gets small and the speed of the programmable logic switch falls.

In another one of the schemes using a nonvolatile flash memory as a memory in the programmable logic switch, one cell in the programmable logic switch is formed of two nonvolatile memory transistors, one switching transistor, and one access transistor. As the memory transistors, for example, flash memory transistors are used. A power supply voltage or 0 V is input to the switching transistor at its gate via one of the two flash memory transistors. The two memory transistors in the same cell share a gate electrode. When it is desired to write data into one of the two memory transistors, a first write voltage is applied to the common gate of the memory transistors and a second write voltage is applied to a memory transistor into which data is to be written, at its source. At this time, 0 V is applied to the gate of the switching transistor via the access transistor. As a result, the second write voltage is applied between the source and drain of the memory transistor into which data is to be written. Accordingly, selective writing is implemented. In this scheme, hot-electrons are used for writing into the memory transistor. In other words, hot-electrons generated by a potential difference between the source and drain are implanted into a charge trap film by the voltage applied to the gate. However, it is known that in general the generation efficiency of hot-electrons falls if the gate length of a transistor becomes smaller than 100 nm. Therefore, the write scheme using hot-electrons becomes difficult because of the size shrinking of transistors. In order to implement the writing, therefore, the ion implantation condition and the like for the memory transistors must be restricted strictly. As a result, the development cost therefor and a cost for holding down variations to low values increases.

DETAILED DESCRIPTION

A nonvolatile programmable logic switch according to an embodiment includes: first and second cells, each of the first and second cells comprising: a first memory having a first terminal, a second terminal, and a third terminal which receives a control signal to control a memory state, the first memory being a first memory transistor having a gate structure formed by stacking a first insulation film, a charge trap film, a second insulation film, and a gate electrode, the source and the drain of the first memory transistor being the first and second terminal, and the gate electrode being the third terminal; a first transistor connected at one of source/drain thereof to the second terminal; and a second transistor connected at a gate thereof to the other of the source/drain of the first transistor, the third terminal of the first memory in the first cell and the third terminal of the first memory in the second cell being connected in common, and when conducting writing into the first memory in the first cell, the third terminal being connected to a write power supply which generates a write voltage, the first terminal of the first memory in the first cell being connected to a ground power supply, and the first terminal of the first memory in the second cell being connected to a write inhibit power supply which generates a write inhibit voltage.

Hereafter, embodiments will be described with reference to the drawings.

First Embodiment

Figure 1:
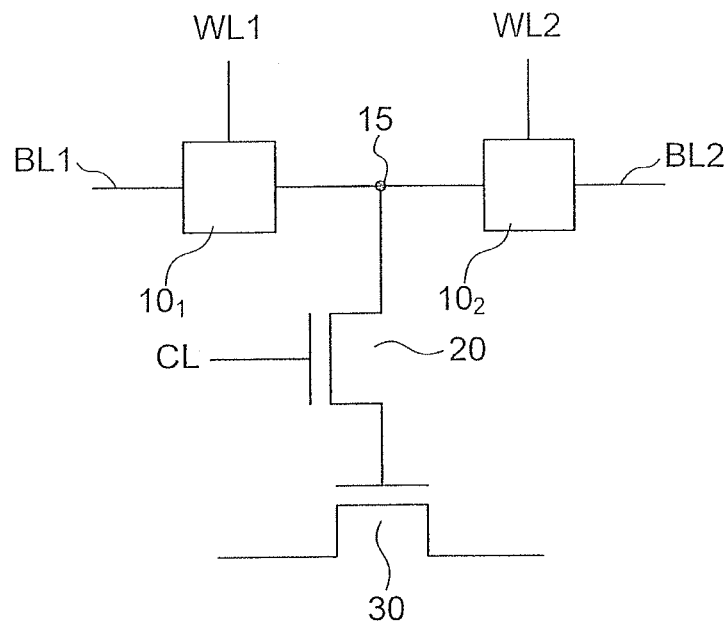
FIG. 1 is a circuit diagram showing a programmable logic switch according to a first embodiment.

A nonvolatile programmable logic switch (hereafter referred to as logic switch as well) according to a first embodiment is shown in FIG. 1. The logic switch according to the first embodiment includes memories $10_1$ and $10_2$ each having two signal electrodes and a control electrode capable of controlling on/off of signal transmission, a cutoff transistor 20, and a pass transistor 30. Both memories $10_1$ and $10_2$ are connected to a common node 15. By the way, the memories $10_1$ is connected to a bit line BL1 and a word line WL1 as well, and the memories $10_2$ is connected to a bit line BL2 and a word line WL2 as well. The cutoff transistor 20 is a MOS transistor, one of its source and drain (hereafter referred to as source/drain as well) is connected to the node 15, and the other of its source and drain is connected to the pass transistor 30 at its gate. Furthermore, the cutoff transistor 20 is connected at its gate to a control line CL.

Even if the potential on the node 15 changes in all operations, such as write and erase operations, of the memories $10_1$ and $10_2$, it is possible in the present embodiment to intercept the potential by the cutoff transistor 20 and prevent a high voltage from being applied to the gate of the pass transistor 30. Hereafter, a voltage applying method in the case where flash memory transistors each having a charge trap film are used as the memories will be described.

First Example

Figure 2:
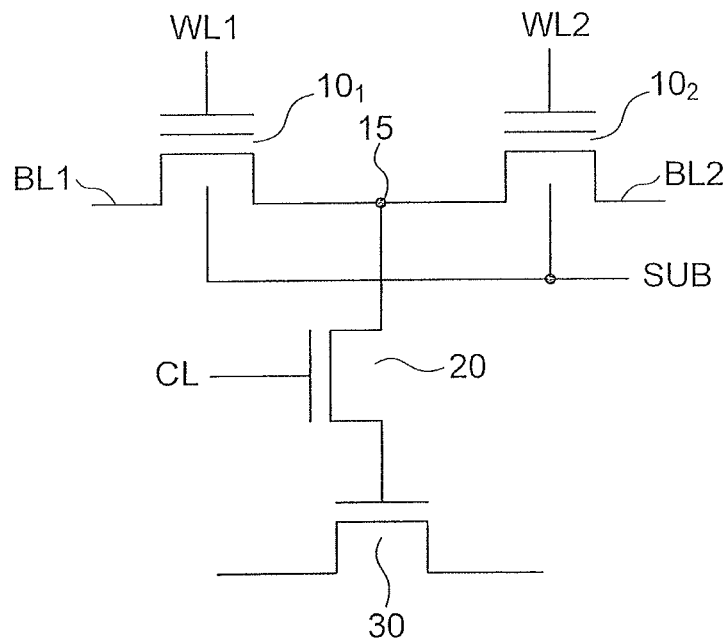
FIG. 2 is a circuit diagram showing a programmable logic switch according to a first example of the first embodiment.

A logic switch according to a first example using flash memory transistors (referred to as memory transistors as well) as the memory transistors $10_1$ and $10_2$ in the first embodiment is shown in FIG. 2. The memory transistors $10_1$ and $10_2$ are fabricated in the same well, and a terminal (electrode) SUB for applying a substrate voltage is provided in this well.

The memory transistors $10_1$ and $10_2$ can be FG (Floating Gate) transistors using a floating gate as the charge trap film or can be MONOS (Metal-Oxide-Nitride-Oxide-Semiconductor) transistors using an insulative silicon nitride film as the charge trap film. In the case where the MONOS transistors are used, however, compatibility of the process with a logic transistor such as the pass transistor is better and it is possible to mixedly mount the memories and a logic circuit in closer vicinity to each other and suppress the area of the chip to a small value.

Figure 3:
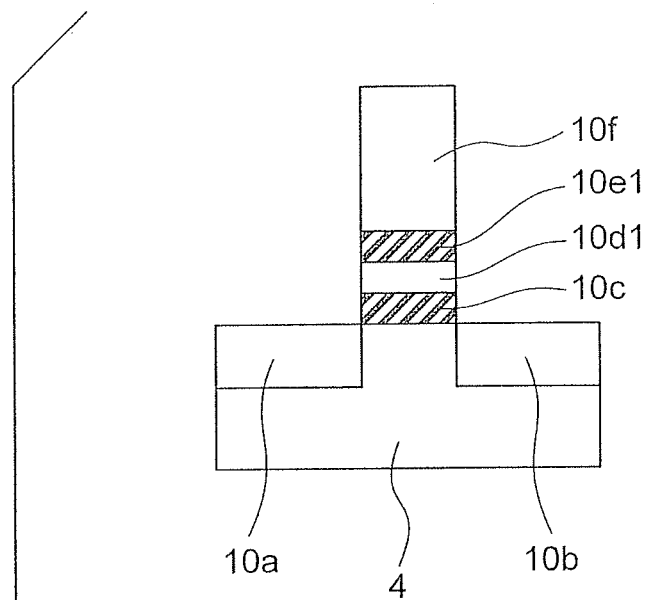
FIGS. 3(a) and 3(b) are sectional views showing an FG transistor and a MONOS transistor, respectively.
Figure 3:
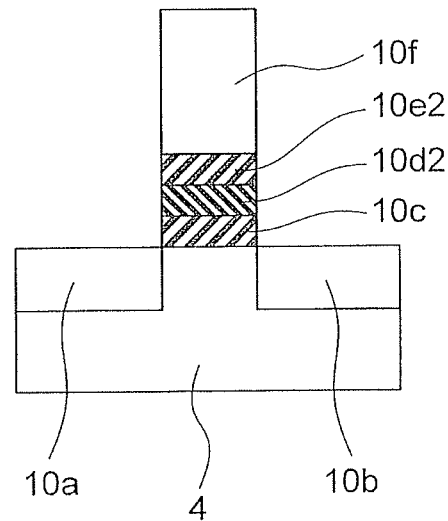

FIGS. 3(a) and 3(b) show general configurations of the FG transistor and the MONOS transistor, respectively. As shown in FIG. 3(a), the FG transistor includes a source 10a and a drain 10b formed in a well 4 with a distance between them, a tunnel film 10c formed on the well 4 between the source 10a and the drain 10b, a floating gate 10d1 formed on the tunnel film 10c, an inter-electrode insulation film 10e1 formed on the floating gate 10d1, and a control gate 10f formed on the inter-electrode insulation film 10e1. As shown in FIG. 3(b), the MONOS transistor includes a source 10a and a drain 10b formed in a well 4 with a distance between them, a tunnel film 10c formed on the well 4 between the source 10a and the drain 10b, a charge trap film 10d2 formed on the tunnel film 10c, a block insulation film 10e2 formed on the charge trap film 10d2, and a control gate 10f formed on the block insulation film 10e2.

The memory transistor $10_1$ is connected at one of its source/drain to the bit line BL1, connected at the other of its source/drain to the node 15, and connected at its gate to the word line WL1. Furthermore, the memory transistor $10_2$ is connected at one of its source/drain to the node 15, connected at the other of its source/drain to the bit line BL2, and connected at its gate to the word line WL2.

Second Example

Figure 4:
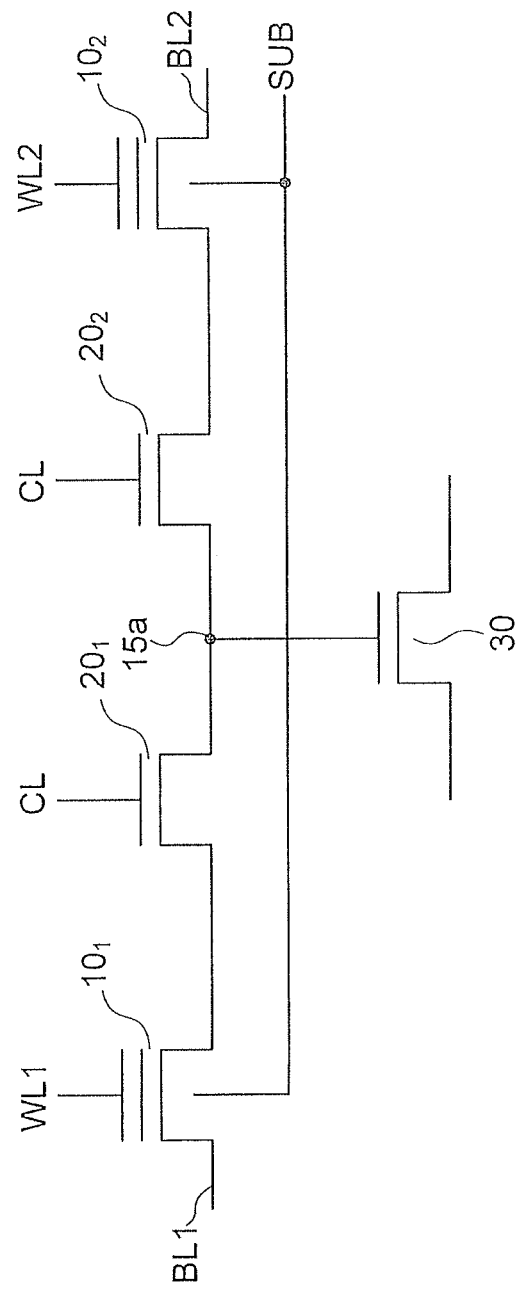
FIG. 4 is a circuit diagram showing a programmable logic switch according to a second example of the first embodiment.

In the first example shown in FIG. 2, one cutoff transistor 20 is used per cell. As in a second example shown in FIG. 4, however, it is possible to use two cutoff transistors $20_1$ and $20_2$ and dispose one cutoff transistor $20_i$ with respect to each memory transistor $10_i$ (i=1, 2). In this case, the cutoff transistor $20_1$ is connected at one of its source/drain to the memory transistor $10_1$ at one of its source/drain, and the cutoff transistor $20_1$ is connected at the other of its source/drain to the node 15a as shown in FIG. 4. Furthermore, the cutoff transistor $20_2$ is connected at one of its source/drain to the memory transistor $10_2$ at one of its source/drain, and the cutoff transistor $20_2$ is connected at the other of its source/drain to the node 15a. Moreover, the pass transistor 30 is connected at its gate to the node 15a. By the way, gates of the cutoff transistors $20_1$ and $20_2$ are connected to the same control line CL.

The structure of the second example shown in FIG. 4 is a structure common to general NOR flash memories in that one select gate (cutoff transistor) is used for one memory transistor. Therefore, there is a merit that fabrication processes used in existing NOR flash memories can be utilized and the development cost can be held down to a low value.

Third Example

Figure 5:
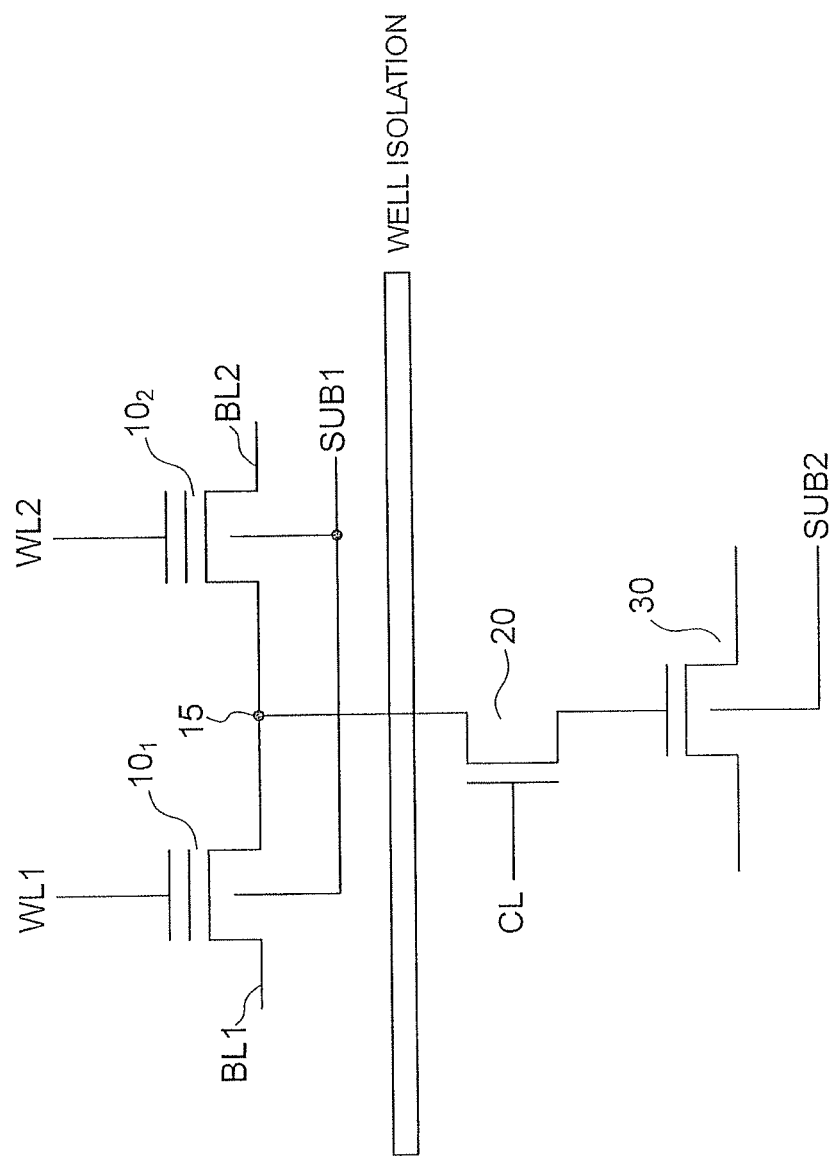
FIG. 5 is a circuit diagram showing a programmable logic switch according to a third example of the first embodiment.

A logic switch according to a third example is shown in FIG. 5. The logic switch according to the third example has a structure obtained by forming the memory transistors $10_1$ and $10_2$, and the cutoff transistor 20 and the pass transistor 30 in different wells isolated by a device isolation region in the first example shown in FIG. 2. Therefore, a terminal SUB1 for applying a substrate bias is provided in a well in which the memory transistors $10_1$ and $10_2$, are formed, and a terminal SUB2 for applying a substrate bias is provided in a well in which the cutoff transistor 20 and the pass transistor 30 are formed. Owing to such a configuration, the substrate bias can be applied to the memory transistors $10_1$ and $10_2$ independently of the cutoff transistor 20 and the pass transistor 30.

Figure 6:
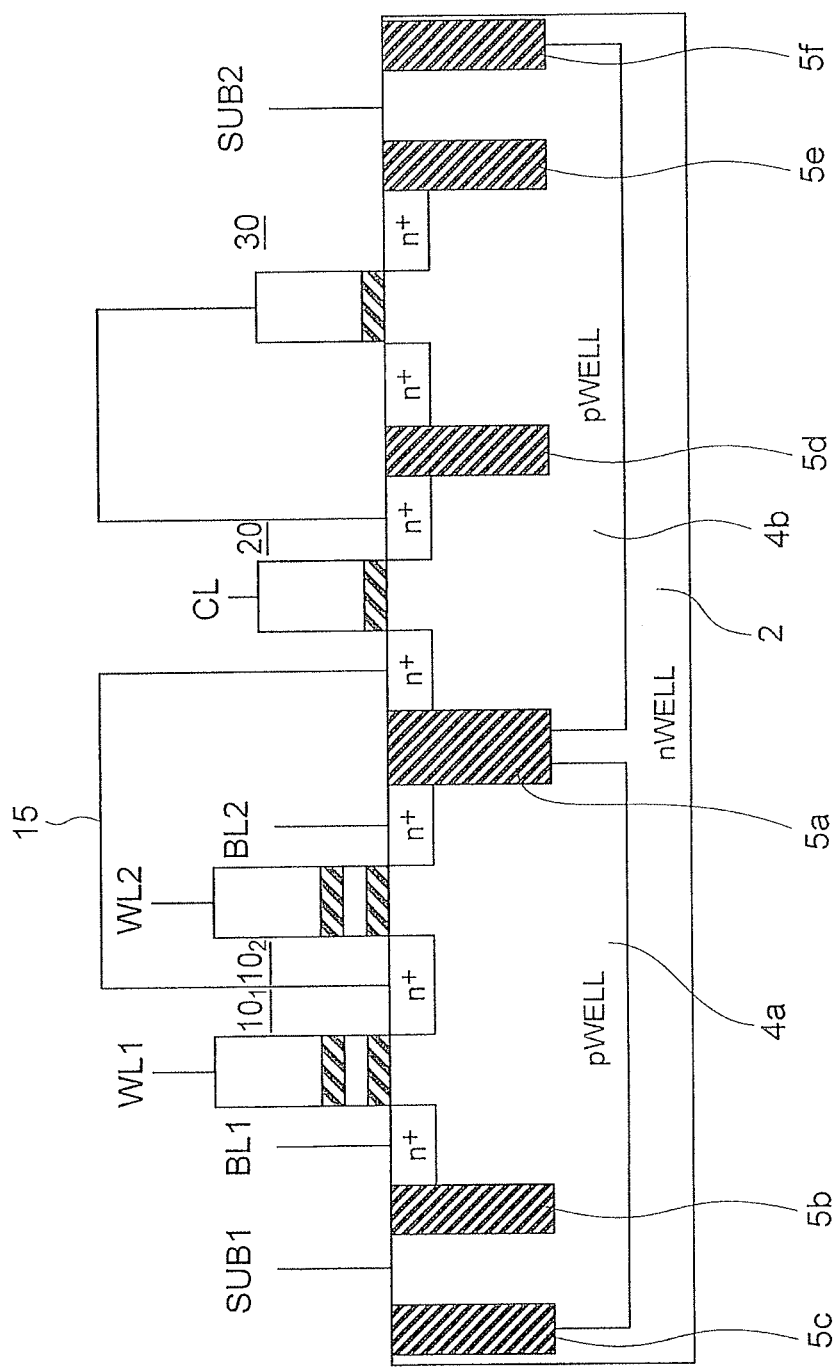
FIG. 6 is a sectional view showing the programmable logic switch according to the third example.

A sectional view showing a configuration of a logic switch according to the third example is shown in FIG. 6. In an n-well, p-wells 4a and 4b are formed. These p-wells 4a and 4b are isolated by a device isolation region 5a. Memory transistors $10_1$ and $10_2$ are formed in the p-well 4a. Furthermore, the terminal SUB1 for applying the substrate bias is provided in the p-well 4a. A region where the terminal SUB1 is provided is isolated from a region where the memory transistors $10_1$ and $10_2$ are formed by a device isolation region 5b. Furthermore, the element region where the terminal SUB1 is provided is isolated from the n-well 2 by a device isolation region 5c. The memory transistor $10_1$ is connected at one of its source/drain to the bit line BL1. The other of the source/drain of the memory transistor $10_1$ is shared with one of the source/drain of the memory transistor $10_2$ and connected to the node 15. The other of the source/drain of the memory transistor $10_2$ is connected to the bit line BL2.

The cutoff transistor 20 and the pass transistor 30 are formed in the p-well 4b. A region where the cutoff transistor 20 is formed is isolated from a region where the pass transistor 30 is formed, by a device isolation region 5d. Furthermore, the terminal SUB2 for applying the substrate bias is provided in the p-well 4b. A region where the terminal SUB2 is provided is isolated from a region where the pass transistor 30 is formed, by a device isolation region 5e. Furthermore, the p-well 4b is isolated from the n-well 2 by an element isolation region 5f. The cutoff transistor 20 is connected at one of its source/drain to the node 15, and connected at the other of its source/drain to the gate of the pass transistor 30.

(Write Method)

Figure 7:
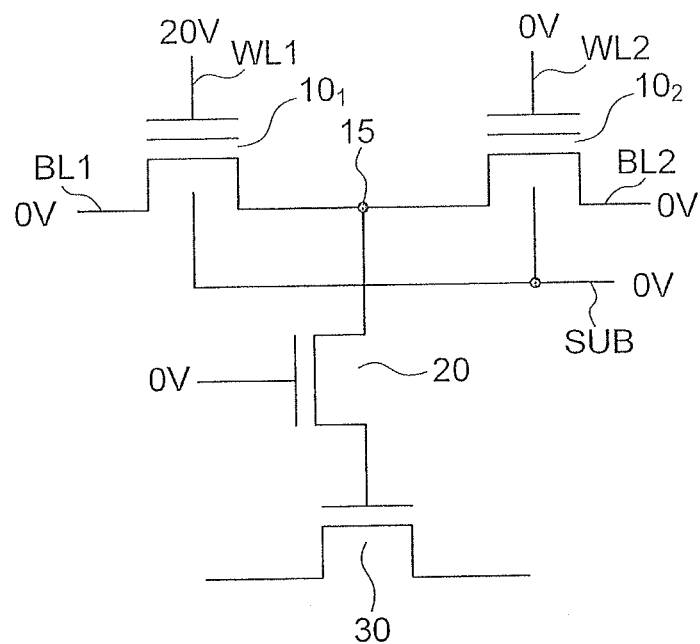
FIG. 7 is a diagram for explaining a write method for a memory in the first embodiment.

A program method (write method) of a memory in the logic switch according to the first embodiment will now be described with reference to FIG. 7. If it is desired to write data selectively into the memory transistor $10_1$, a write voltage is applied to the word line WL1. The write voltage is, for example, 20 V. 0 V is applied to the word line WL2 connected to the gate of the memory transistor $10_2$ to be not written in. Furthermore, 0 V is applied to both the bit lines BL1 and BL2. At this time, a channel is formed in the memory transistor $10_1$, and electrons are injected from the channel into the charge trap film by an FN current. On the other hand, a channel is not formed in the memory transistor $10_2$, and consequently writing into the memory transistor $10_2$ does not occur.

(Write Preventing Method)

Figure 8:
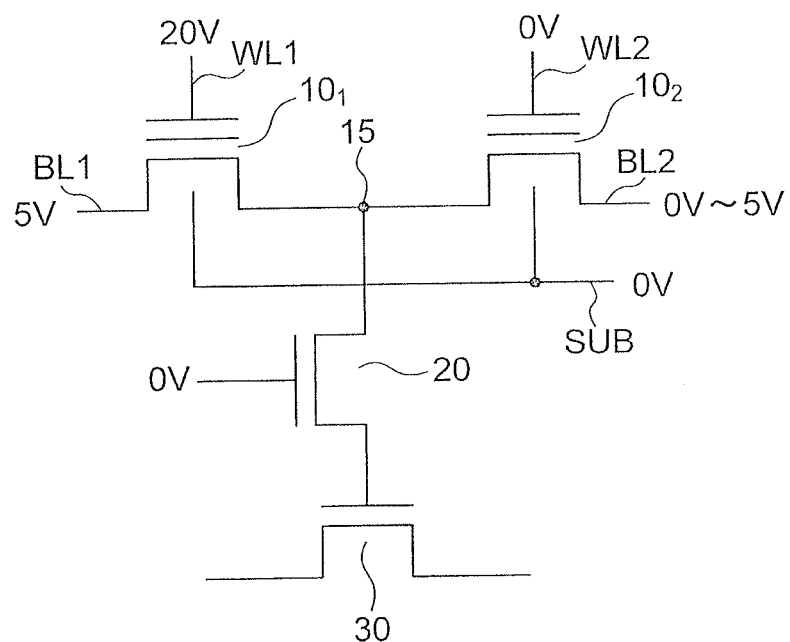
FIG. 8 is a diagram for explaining a write preventing method for a memory in the first embodiment.

In the case where a plurality of logic switches are arranged in an array, a plurality of memory transistors share a word line. If a write voltage 20 V is applied to a word line connected to the gate of a memory transistor to be written in, therefore, the 20 V is also applied to a gate of a memory transistor which is other than the memory transistor to be written in and which is connected to the word line, i.e., a gate of a memory transistor to be not written in. In order to implement selective writing, therefore, a write inhibit voltage of 5 V is applied to the bit line BL1 connected to the memory transistor $10_1$ to be not written in as shown in FIG. 8 and consequently unexpected writing error into a memory transistor to be not written in is prevented. In the memory transistor $10_1$ to be not written in, the voltage of 20 V is applied to its gate and consequently a channel is formed. Since a potential on the channel is 5 V which is equal to the potential on the bit line BL1 and a potential difference between the channel and the gate is 15 V, however, writing error does not occur. At this time, the potential on the node 15 is also 5 V. If the cutoff transistor 20 is brought into the off-state by adjusting the potential on the control line CL connected to the gate of the cutoff transistor 20, however, 5 V is not applied to the gate of the pass transistor 30. In FIG. 8, the voltage applied to the control line CL is 0 V. However, the voltage applied to the control line CL cannot be 0 V as long as it is lower than a threshold voltage of the cutoff transistor 20. The voltage applied to the bit line BL2 can be equal to the voltage applied to the bit line BL1, or can be 0 V. In the case where 0 V is applied, however, the voltage applied to the word line WL2 must be made lower than a threshold voltage of the memory transistor $10_2$. The reason is as follows: if a voltage of at least the threshold voltage is applied to the gate of the memory transistor $10_2$ in a state in which there is a potential difference between the source/drain of the memory transistor $10_2$, there is a fear that data will be written into the memory transistor $10_2$ by generated hot-electrons.

(Erase Method)

Figure 10:
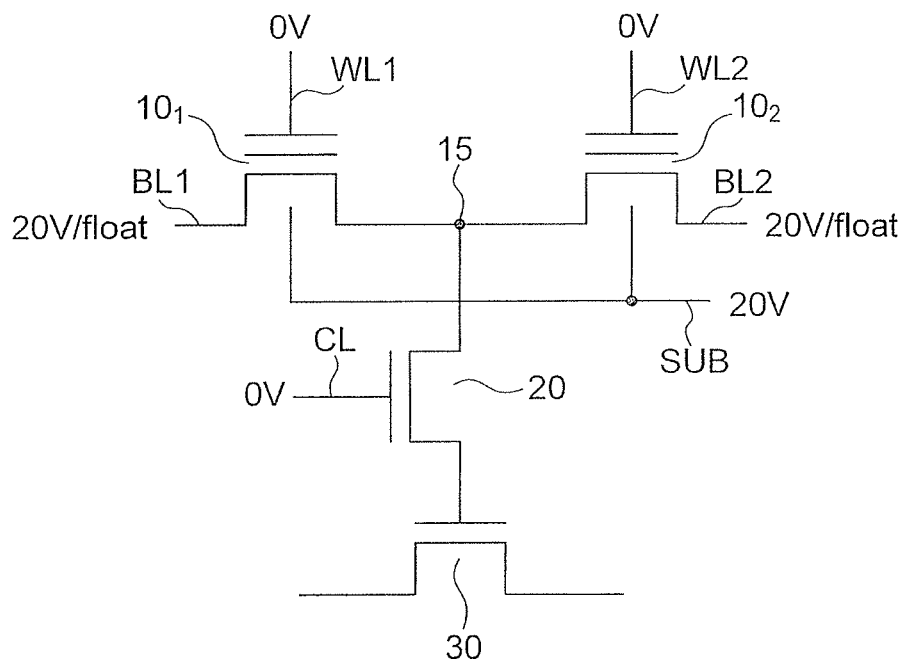
FIG. 10 is a diagram for explaining a second concrete example of an erase method for a memory in the first embodiment.
Figure 11:
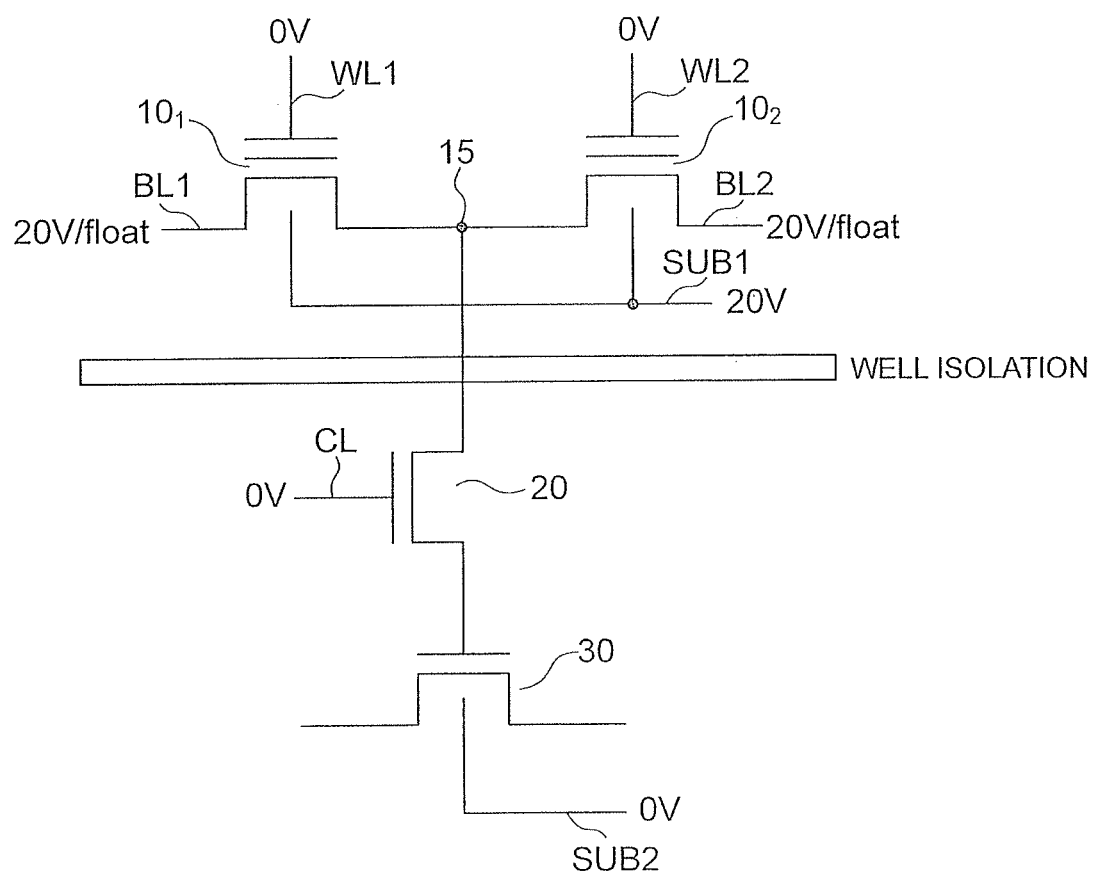
FIG. 11 is a diagram for explaining a third concrete example of an erase method for a memory in the first embodiment.

A method for erasing data in memories in the logic switch according to the first embodiment in the lump will now be described with reference to FIGS. 9 to 11.

Figure 9:
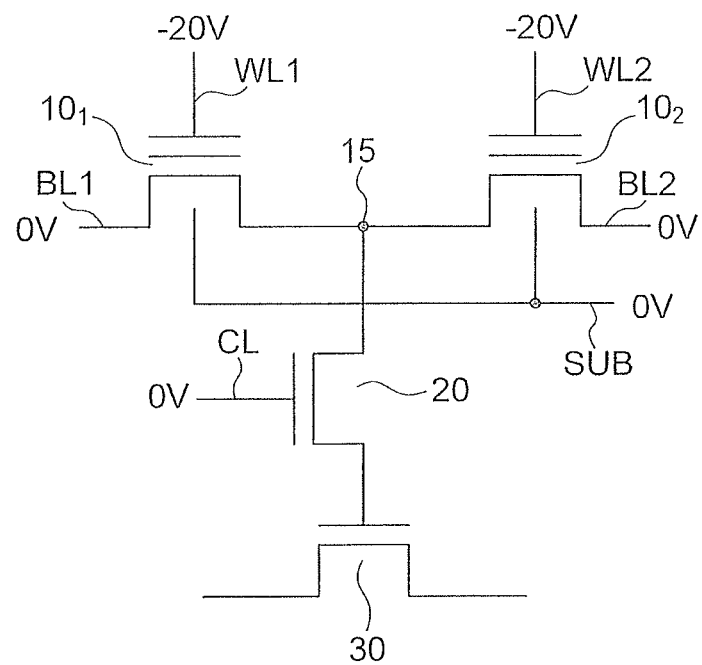
FIG. 9 is a diagram for explaining a first concrete example of an erase method for a memory in the first embodiment.

FIG. 9 shows a first concrete example of the erase method. An erase voltage is applied to the word lines WL1 and WL2 in a state in which 0 V is applied to the terminal SUB as the substrate bias and both potentials on the bit lines BL1 and BL2 are made to be 0 V. At this time, the erase voltage is negative in sign and is, for example, −20 V. A second concrete example of the erase method is shown in FIG. 10. In the second concrete example of the erase method shown in FIG. 10, a positive erase voltage of, for example, 20 V is applied to the terminal SUB in a state in which the word lines WL1 and WL2 are brought to 0 V. At this time, the bit lines BL1 and BL2 should be kept in the floating state, or should be supplied with a voltage which is at least the voltage applied to the terminal SUB. In the case of the second concrete example shown in FIG. 10, a negative voltage is not necessary and consequently a power supply for negative voltage cannot be provided and an advantage that the area can be made small is obtained. If the well for the memory transistor is common to the well for the pass transistor, however, the substrate bias is output from the pass transistor 30 via the source/drain of the pass transistor 30 by applying 20 V as the substrate bias. In general, it is considered that an output of the pass transistor 30 is connected to, for example, an input of an inverter. If the voltage of 20 V is applied to the input of the inverter, then a problem that gate breakdown of the transistor in the inverter might occur is posed. This problem can be solved by adopting a configuration capable of applying different substrate biases to the memory transistors $10_1$ and $10_2$ and the pass transistor 30 respectively, i.e., a configuration in a third example. If in this case, for example, the substrate bias of the pass transistor 30 is set equal to 0 V as indicated in an erase method of a third concrete example shown in FIG. 11, the problem can be solved.

On the other hand, in the erase method in the first concrete example shown in FIG. 9, the substrate bias applied to the terminal SUB is set equal to 0 V and consequently a high voltage is not output from the pass transistor 30. Furthermore, even if the potential on the node 15 is modulated in the negative direction by a negative voltage applied to the word lines WL1 and WL2, the substrate bias of 0 V is applied via the source/drain of the memory transistors $10_1$ and $10_2$, and the potential on the node 15 gets equal to 0 V swiftly.

(Operation of Logic Switch)

Figure 12:
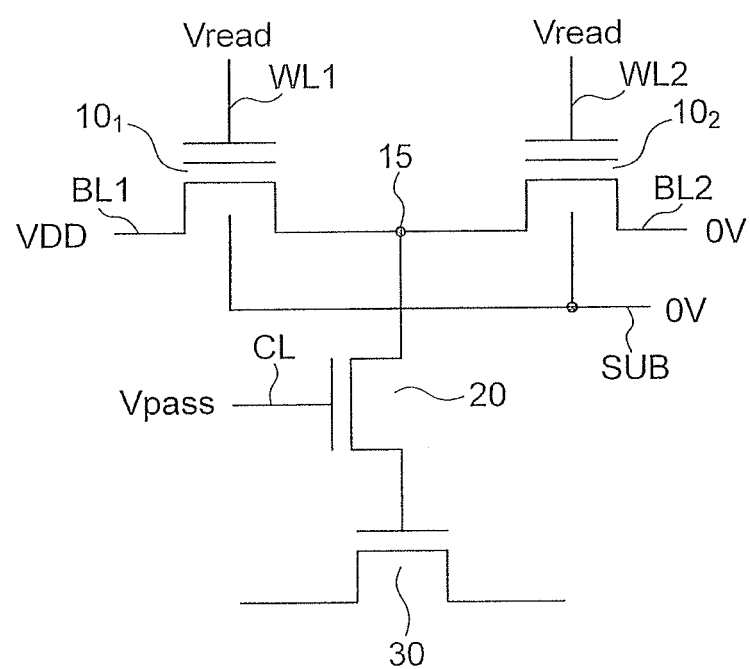
FIG. 12 is a diagram showing an example of a voltage applying condition in a case where a programmable logic switch according to the first embodiment is made to operate.

An example of a voltage condition in a case where the programmable logic switch is made to operate on the basis of information written into a memory is shown in FIG. 12. It is now supposed that the memory transistor $10_1$ and the memory transistor $10_2$ are programmed in different states, respectively. For example, if the memory transistor $10_1$ is in a write state, the memory transistor $10_2$ is in an erase state. A read voltage Vread is applied to the word lines WL1 and WL2. The read voltage Vread is an arbitrary voltage which is greater than a threshold voltage of the memory transistors $10_1$ and $10_2$ in the erase state and which is less than a threshold voltage of the memory transistors $10_1$ and $10_2$ in the write state. Furthermore, a voltage Vpass which is at least the threshold voltage of the cutoff transistor 20 is applied to the control line CL to electrically connect the gate of the pass transistor 30 to the node 15. As for the bit lines BL1 and BL2, the power supply voltage VDD is applied to one of them, and 0 V is applied to the other of them. In response to the program state of the memory transistors, the gate of the pass transistor 30 is connected to the power supply voltage VDD or 0 V and the pass transistor 30 is brought into the on-state or off-state.

In general, even if the power supply is cut off, data are not lost in the nonvolatile programmable logic switch. Therefore, it is possible to implement the power gating technique which reduces the power consumption of the whole chip by cutting off the power supply for regions which are not being used. In general, a transistor for signal interception is provided between the power supply and the memory transistors to prevent the power supply voltage from being applied to the memory transistor. In this case, however, additional transistors for cutting off the power supply are necessary.

In the first embodiment, it is possible to prevent the power supply voltage from being applied to the gate of the pass transistor 30 by turning off the cutoff transistor 20 in regions which are not being used. As a result, it is possible to exclude power consumption caused by a gate leakage current of the pass transistor 30 and it becomes possible to yield an effect equivalent to that of the power gating.

(Logic Switch Arranged in Array Form)

Concrete examples of a circuit in a case where the logic switches according to the first embodiment are arranged in an array form as cells will now be described with reference to FIGS. 13 to 16.

First Concrete Example

Figure 13:
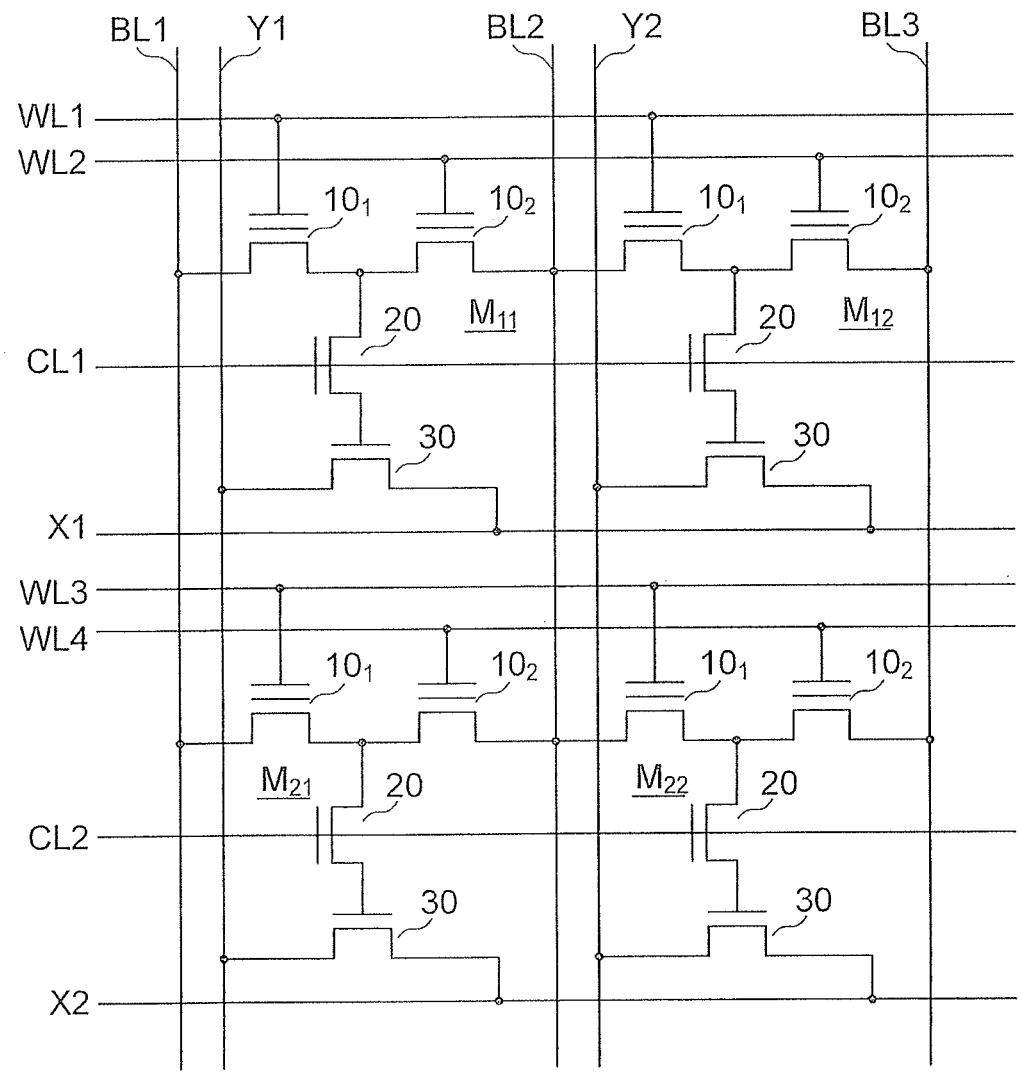
FIG. 13 is a diagram showing a first concrete example of a circuit in a case where logic switches according to the first embodiment are arranged in an array form as cells.

A first concrete example shown in FIG. 13 is a circuit in the case where cells which are adjacent to each other in the row direction share a part of a bit line. The first concrete example shown in FIG. 13 includes cells $M_{ij}$ (i, j=1, 2) arranged in two rows by two columns. For example, a cell $M_{11}$ and a cell $M_{12}$ are cells which are adjacent to each other in the row direction, and the cells $M_{11}$ and $M_{12}$ share the bit line BL2. By the way, each cell is, for example, the logic switch in the first example shown in FIG. 2.

In the cells $M_{11}$ and $M_{12}$ in a first row, the memory transistor $10_1$ is connected at its gate to the word line WL1, the memory transistor $10_2$ is connected at its gate to the word line WL2, and the cutoff transistor 20 is connected at its gate to a control line CL1.

In the cells $M_{21}$ and $M_{22}$ in a second row, the memory transistor $10_1$ is connected at its gate to a word line WL3, the memory transistor $10_2$ is connected at its gate to a word line WL4, and the cutoff transistor 20 is connected at its gate to a control line CL2.

In the cells $M_{11}$ and $M_{21}$ in a first column, the memory transistors $10_1$ and $10_2$ are connected at one of its source/drain to the bit lines BL1 and BL2, respectively. Furthermore, the path transistor 30 is connected at one of its source/drain to an interconnection Y1 disposed in the column direction, and connected at the other of its source/drain to an interconnection X1 or an interconnection X2 disposed in the row direction.

In the cells $M_{12}$ and $M_{22}$ in a second column, the memory transistors $10_1$ and $10_2$ are connected at one of its source/drain to the bit lines BL2 and BL3, respectively. Furthermore, the path transistor 30 is connected at one of its source/drain to an interconnection Y2 disposed in the column direction, and connected at the other of its source/drain to the interconnection X1 or the interconnection X2 disposed in the row direction.

Figure 14:
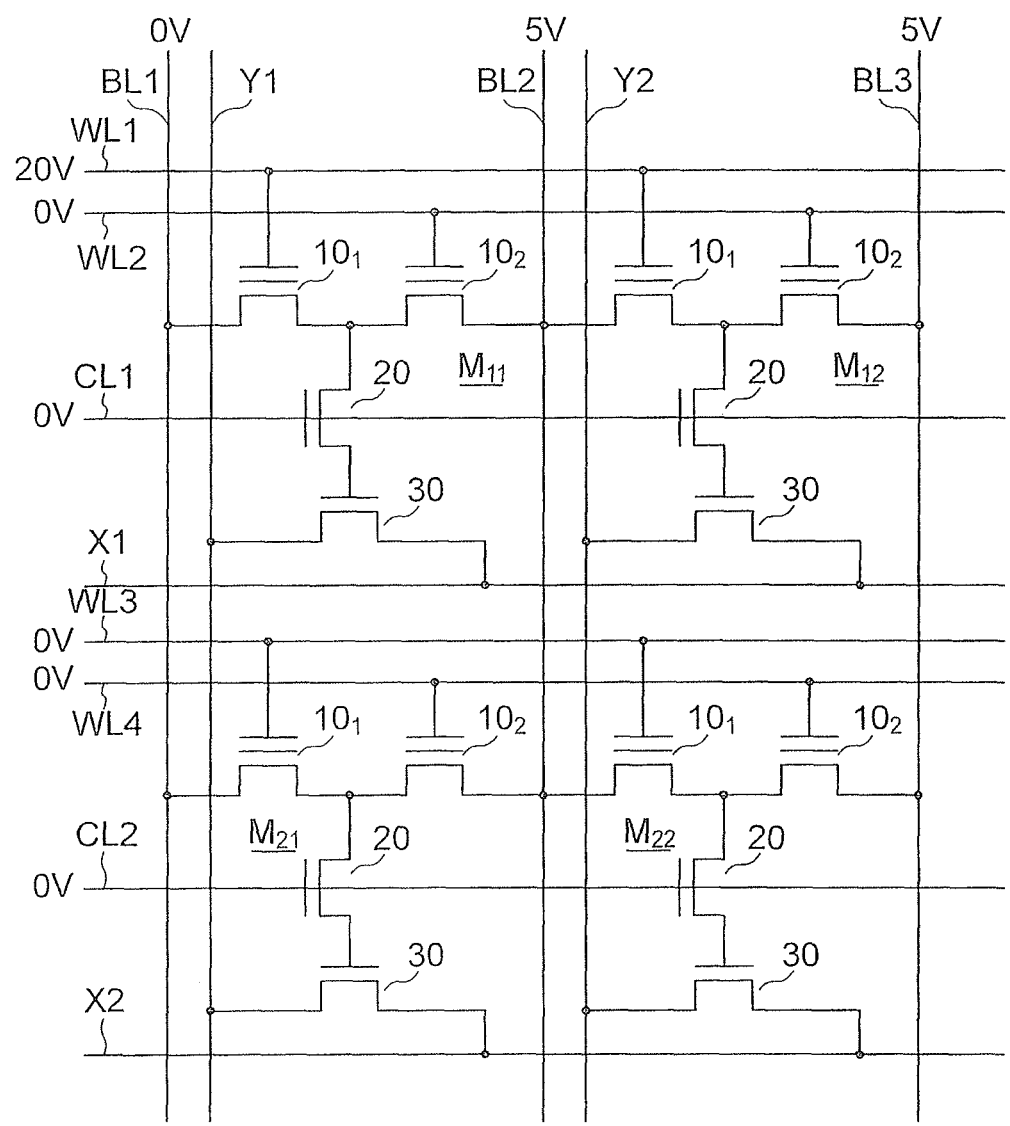
FIG. 14 is a diagram for explaining a write method in the circuit of the first concrete example.

Writing in the circuit in the first concrete example having such a configuration will now be described with reference to FIG. 14. FIG. 14 is a diagram for explaining a write method used when conducting writing into the memory transistor $10_1$ connected to the word line WL1 and the bit line BL1 in the circuit of the first concrete example. Among the bit lines BL1, BL2 and BL3, 0 V is applied to the bit line BL1 connected to the memory transistor to be written in, whereas the write inhibit voltage is applied to other bit lines BL2 and BL3. Writing is conducted by using the method described in the first embodiment.

Second Concrete Example

Figure 15:
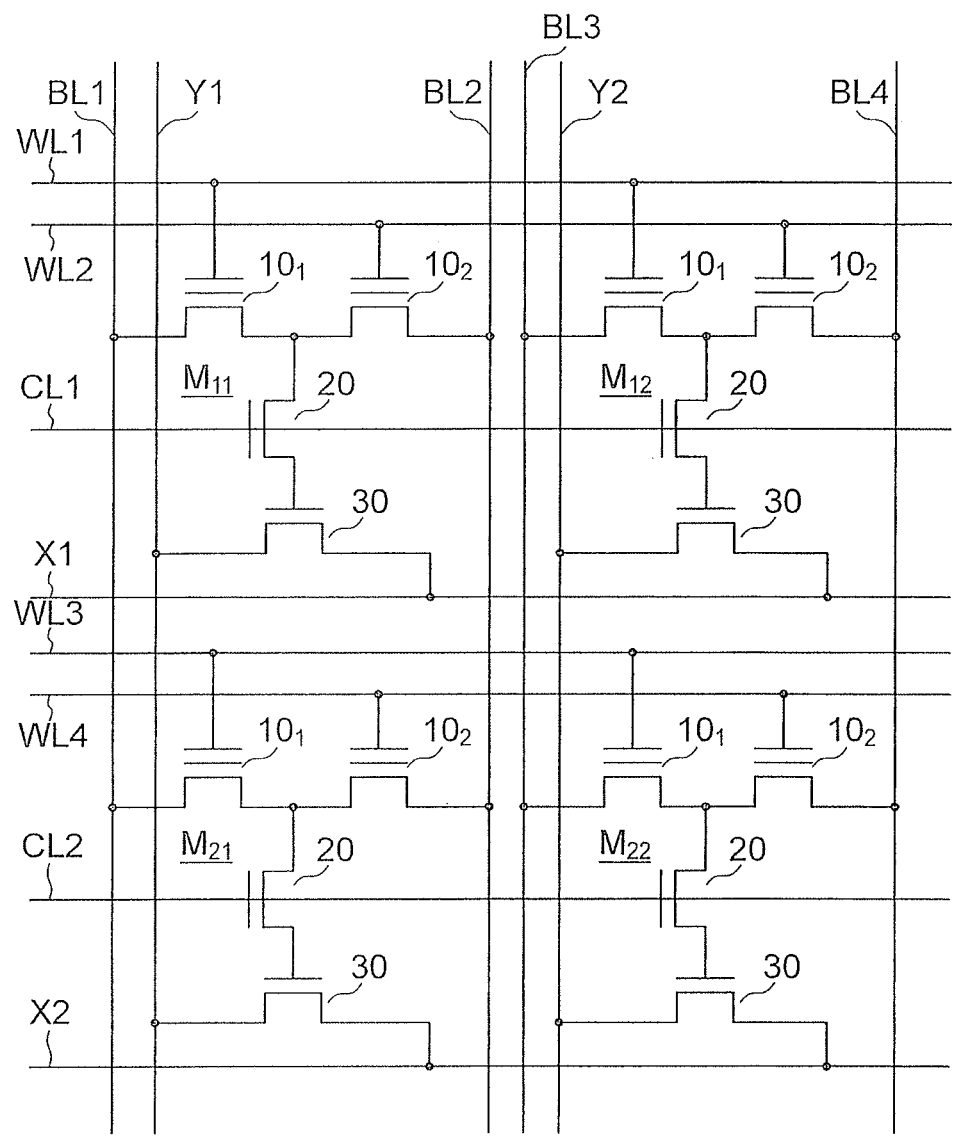
FIG. 15 is a diagram showing a second concrete example of a circuit in a case where logic switches according to the first embodiment are arranged in an array form as cells.

A second concrete example shown in FIG. 15 is a circuit in a case where cells which are adjacent to each other in the row direction do not share a bit line. In other words, in the first concrete example shown in FIG. 13, a bit line connected to the memory transistor $10_2$ in the cell in the first column and a bit line connected to the memory transistor $10_1$ in the cell in the second column are the same bit line BL2. In the second concrete example, a bit line connected to the memory transistor $10_2$ in the cell in the first column is the bit line BL2, whereas a bit line connected to the memory transistor $10_1$ in the cell in the second column is the bit line BL3. A bit line connected to the memory transistor $10_2$ in the cell in the second column is a bit line BL4. The configuration is the same as that in the first concrete example except that cells which are adjacent in the row direction do not share a bit line.

Figure 16:
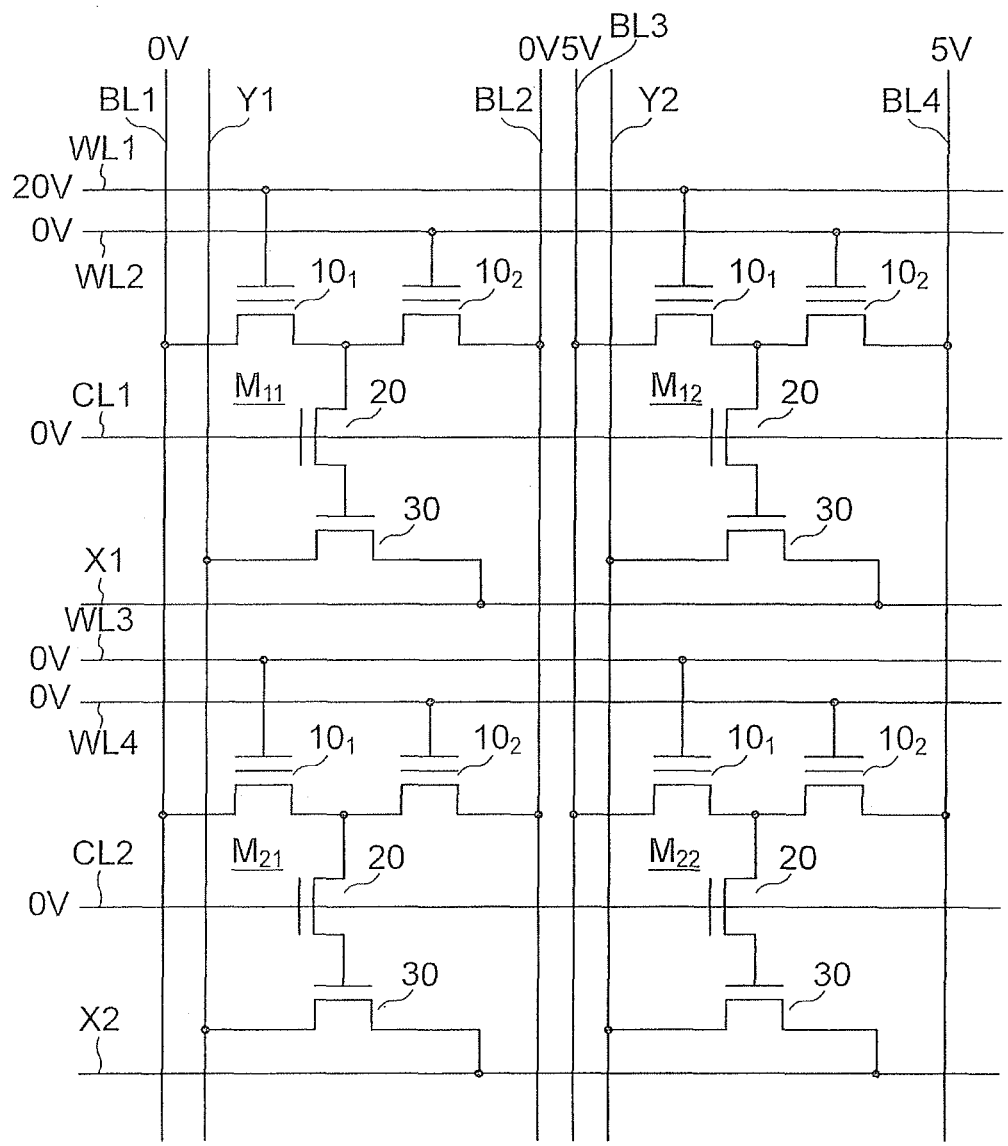
FIG. 16 is a diagram for explaining a write method in the circuit of the second concrete example.

Writing in the circuit in the second concrete example will now be described with reference to FIG. 16. FIG. 16 is a diagram for explaining a write method used when conducting writing into the memory transistor $10_1$ connected to the word line WL1 and the bit line BL1. Selective writing is implemented by applying 0 V to the bit lines BL1 and BL2 and applying the write inhibit voltage to the bit lines BL3 and BL4.

There are device requirements described hereafter for the cutoff transistor 20 in the present embodiment.

First, the gate insulation film in the cutoff transistor 20 must withstand the write inhibit voltage because in the write preventing method shown in FIG. 8 the gate insulation film in the cutoff transistor 20 is subjected to the write inhibit voltage at its edge on the node 15 side. Denoting a film thickness of the gate insulation film of the cutoff transistor 20 by $T_c$, conditions required for the film thickness $T_c$ will now be found. Hereafter, every film thickness is represented by EOT (Equivalent Oxide Thickness). The equivalent oxide thickness $T_{eq}$ is found according to the following Expression (1) by using a physical film thickness $T_o$ which can be measured by means of TEM (Transmission Electron Microscopy) analysis or the like, a dielectric constant $\in$ of the insulation film, and a dielectric constant $\in_{SiO2}$ of $SiO_2$.

$$T_{eq} = T_o \times \in_{SiO2} / \in \quad (1)$$

In the memory transistor, there are a lower limit of electric field $E_{lim1}$ which is applied to the gate insulation film and which is required to write data, and an upper limit of electric field $E_{lim2}$ which is applied to the gate insulation film and with which writing does not occur. Denoting the total sum of film thicknesses of the gate insulation film of the memory transistor by $T_M$, a write inhibit voltage $V_{inh}$ needs to satisfy a condition expressed by the following Expression (2).

$$V_{inh} \geq (E_{lim1} - E_{lim2}) \times T_M \quad (2)$$

Here, the total sum $T_M$ of film thicknesses means the sum of a film thickness of the tunnel film and a film thickness of the inter-electrode insulation film, in the case of an FG memory transistor. On the other hand, in the case of the MONOS memory transistor, which employs an insulation film such as a silicon nitride film to trap charges, $T_M$ means the sum of a film thickness of the tunnel film, a film thickness of the charge trap film, and a film thickness of the block insulation film.

When a write inhibit voltage $V_{inh}$ is applied to the gate insulation film in the cutoff transistor, an electric field $E_C$ is found by using the following Expression (3).

$$E_C = V_{inh} / T_C \quad (3)$$

Denoting an electric field which causes the breakdown of the gate insulation film by $E_{BK}$, the electric field $E_C$ must be less than the breakdown electric field $E_{BK}$. Combining Expression (3) with Expression (2), therefore, the following Expression (4) is led.

$$T_C \geq (E_{lim1} - E_{lim2}) \times T_M / E_{BK} \quad (4)$$

In the general flash memory, a difference between the lower limit of electric field $E_{lim1}$ and the upper limit of electric field $E_{lim2}$ is approximately 5 MV/cm. As for a criterion of the breakdown electric field $E_{BK}$, a high voltage is applied to the gate insulation film in the cutoff transistor only when writing into the memory is conducted, and this does not hold true during the operation of the logic switch. An electric field applied to the tunnel insulation film in the flash memory at the time of writing is approximately 20 MV/cm. Setting this as the criterion of the breakdown electric field $E_{BK}$, it is found from Expression (4) that the total sum $T_C$ of the film thicknesses is at least $T_M/4$.

Furthermore, the electric field applied to the gate insulation film should be less than 10 MV/cm to implement a transistor having higher reliability. Using this as the breakdown electric field $E_{BK}$, it is required that the total sum $T_C$ of the film thicknesses is at least $T_M/2$.

If reliability equivalent to that of the ordinary logic transistor is required of the cutoff transistor, it is required from the foregoing description that the total sum $T_C$ of the film thicknesses is at least $T_M/2$. On the other hand, if only reliability equivalent to that of the flash memory transistor is required of the cutoff transistor, it is required that the total sum $T_C$ of the film thicknesses is at least $T_M/4$.

For ensuring high speed of the logic switch, the film thickness of the gate insulation film in the pass transistor is desired to be several nm. On the other hand, the total sum of the film thicknesses of the gate insulation film in the memory transistor is approximately 15 nm. Because of the above-described requirement, therefore, the film thickness of the gate insulation film in the cutoff transistor is greater than that of the pass transistor. If different gate insulation films of three kinds are prepared for the memory transistor, the cutoff transistor, and the pass transistor, however, it is disadvantageous in respect of the process cost because of an increased number of times of lithography.

Figure 17:
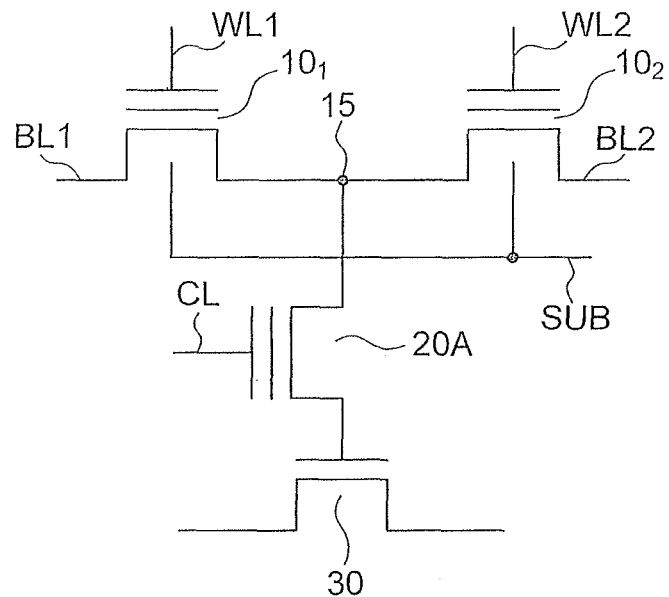
FIG. 17 is a circuit diagram showing a programmable logic switch according to a fourth example of the first embodiment.

For reducing the cost, therefore, it is desirable to make the structure of the gate insulation film in the cutoff transistor the same as that in the memory transistor. A logic switch in this case is shown in FIG. 17. The logic switch in a fourth example shown in FIG. 17 has a configuration obtained by replacing the cutoff transistor 20 with a flash memory transistor 20A in the logic switch in the first example shown in FIG. 2. As a result, a gate stack of the memory transistors $10_1$ and $10_2$ and a gate stack of the cutoff transistor 20A can be fabricated in the same process. Therefore, it is possible to reduce the cost because of the process simplification. Furthermore, in the case where a plurality of transistors which differ in the configuration of the gate insulation film are prepared, it is necessary to provide a large spacing between a transistor and another transistor due to limitations of fabrication processes.

In the case of the fourth example shown in FIG. 17, however, the gap becomes unnecessary and consequently it is possible to reduce the area of the chip.

As a second requirement for the cutoff transistor, the junction between the source/drain and the channel must withstand the write inhibit voltage. Here the terminal of the cutoff transistor 20 which is connected to the node 15 is defined as source. If the cutoff transistor 20 is n-type, its source is doped to the n-type and its channel is doped to the p-type. Since the potential on the channel is equal to the substrate potential and is typically 0 V, a reverse bias which is equal to the write inhibit voltage in magnitude is applied across a pn junction between the source and the channel. In general, the breakdown voltage of a pn junction becomes smaller as the doping concentration in both regions gets higher. In the cutoff transistor, therefore, a limit is imposed on an impurity concentration in the source or the channel.

First, the channel impurity concentration in the cutoff transistor will now be discussed. By the way, in the present specification, an impurity concentration is supposed to be an impurity concentration after activation. This impurity concentration can be measured by analysis using, for example, an SSRM (Scanning Spread Resistance Microscope) or the like. The impurity concentration in the channel is denoted by $N_{CH}$, and it is supposed that a channel-source junction is an abrupt junction in which the source is doped with high concentration. Then relational Expression (5) holds true between the breakdown voltage $V_{BK}$ and a maximum electric field $E_m$ in the pn junction (see, for example, Appl. Phys. Lett. 8, 111 (1966)).

$$V_{BK} = (\in_S \times E_m^2)/(2 \times q \times N_{CH}) \tag{5}$$

Here, $\in_S$ is a dielectric constant of silicon, and q is an elementary electric charge. Since the write inhibit voltage $V_{inh}$ must be $V_{BK}$ or below, the following Expression (6) holds true.

$$N_{CH} \leq (\in_S \times E_m^2)/(2 \times q \times V_{inh}) \tag{6}$$

In addition, the Expression (6) can be rewritten by using Expression (2) as represented by the following Expression (7).

$$N_{CH} \leq (\in_S \times E_m^2)/(2 \times q \times (E_{lim1} - E_{lim2}) \times T_M) \tag{7}$$

In general flash memory, the difference between $E_{lim1}$ and $E_{lim2}$ is approximately 5 MV/cm. Furthermore, the maximum electric field $E_m$ when the breakdown of a junction occurs is generally approximately 2 MV/cm. Therefore, the following Expression (8) is led as regards the impurity concentration $N_{CH}$.

$$N_{CH} \leq 2 \times \in_S/(5 \times q \times T_M) \tag{8}$$

For example, if $T_M=15$ nm, the impurity concentration $N_{CH}$ must be $1.7 \times 10^{18}$ cm$^{-3}$ or less.

Next, the impurity concentration in the source/drain of the cutoff transistor will be discussed. In the foregoing description, the necessary condition of the impurity concentration in the channel has been found supposing that the source of the cutoff transistor is doped with high concentration. As a matter of fact, however, the channel impurity concentration $N_{CH}$ cannot be made small immoderately in order to prevent characteristics from being degraded by size shrinking. For example, if the gate length is 100 nm or less, an impurity concentration of $1 \times 10^{18}$ cm$^{-3}$ or more is necessary as $N_{CH}$. Instead, therefore, it is necessary to make the impurity concentration $N_s$ in the source low to some degree.

When the write inhibit voltage $V_{inh}$ is applied to an abrupt step pn junction in which one impurity concentration is $N_{CH}$ and the other impurity concentration is $N_S$, the maximum electric field $E_m$ in the pn junction is found as represented by the following Expression (9).

$$E_m = ((2 \times (\phi + V_{inh}) \times q \times N_{CH} \times N_S)/(\in_S \times (N_{CH} + N_S)))^{1/2} \tag{9}$$

Here, $\phi$ is a built-in potential for the pn junction, and it is approximately 1 V. Substituting $E_{lim1} - E_{lim2} = 5$ MV/cm and $T_M = 15$ nm into Expression (2), $V_{inh}$ is found to be 7.5 V. As for the maximum electric field $E_m$ when junction breakdown occurs, approximately 2 MV/cm is its criterion. For example, if the impurity concentration $N_{CH}$ is in the first half of a $1 \times 10^{18}$ cm$^{-3}$ level, excess of the impurity concentration $N_S$ in the source over one hundred times the impurity concentration $N_{CH}$ in the channel causes the maximum electric field $E_m$ to begin to exceed 2 MV/cm. In other words, one hundred times of $N_{CH}$ or less is a criterion of the impurity concentration $N_S$ for preventing the junction breakdown. In the general logic transistor, $N_S$ has an impurity concentration of approximately $1 \times 10^{21}$ cm$^{-3}$ or more. As compared with the general logic transistor, the impurity concentration $N_S$ in the source of the cutoff transistor must be made very small.

On the other hand, if the impurity concentration $N_S$ in the source is less than the impurity concentration $N_{CH}$ in the channel, the net polarity of impurities in the source changes. Thus consequently the impurity concentration $N_S$ in the source needs to satisfy the condition indicated by the following Expression (10).

$$N_{CH} < N_S < N_{CH} \times 100 \tag{10}$$

The foregoing description concerns the source of the cutoff transistor, i.e., the n-doped diffusion layer connected to the node 15. On the other hand, on the drain side, the write inhibit voltage is not applied to the junction between the drain and channel. As regards the impurity concentration in the drain, therefore, it is not necessary to consider the restriction as described above. For reducing the resistance between the source and drain of the cutoff transistor, it is desired that the impurity concentration in the drain is sufficiently high. As for the impurity concentration in the source/drain of the cutoff transistor, therefore, the impurity concentration on the drain side should be made higher as compared with that on the source side. When the resistance between the source and drain of the cutoff transistor is made small, the potential on the gate in the pass transistor can be fixed more intensely in the operation of the logic switch and consequently operation error of the pass transistor can be suppressed.

In writing into the memory transistor, a region between the source and drain of the cutoff transistor subjected to the strongest voltage is the pn junction between the channel and the source. If a voltage equivalent to the write inhibit voltage is applied to the pn junction in the reverse direction, a depletion layer is formed on a boundary of the pn junction. A width $W_D$ of the depletion layer is represented by the following Expression (11) using the impurity concentration $N_{CH}$ in the channel of the cutoff transistor, the impurity concentration $N_S$ in the source, and the write inhibit voltage $V_{inh}$.

$$W_P = ((2 \times \in_S \times (N_{CH} + N_S) \times (\phi + V_{inh})/(q \times N_{CH} \times N_S))^{1/2} \tag{11}$$

If the depletion layer generated on the source side is connected to the drain, the cutoff transistor does not operate normally. Therefore, a gate length $L_G$ of the cutoff transistor must be greater than $W_D$. Since the built in potential $\phi$ is approximately 1 V, the gate length $L_G$ must satisfy a condition represented by Expression (12).

$$L_G > ((2 \times \in_S \times (N_{CH} + N_S) \times (\phi + V_{inh})/(q \times N_{CH} \times N_S))^{1/2} \tag{12}$$

Substituting φ=1 V and $V_{inh}$=7.5 V into Expression (12), Expression (13) is obtained.

$$L_G > ((17 \times \in_S \times (N_{CH}+N_S)/(q \times N_{CH} \times N_S))^{1/2} \qquad (13)$$

For example, if $N_{CH}$ is $2 \times 10^{18}$ cm$^{-3}$ and $N_s$ is $2 \times 10^{20}$ cm$^{-3}$, the gate length $L_G$ is found to be at least 75 nm.

First Comparative Example

Figure 18:
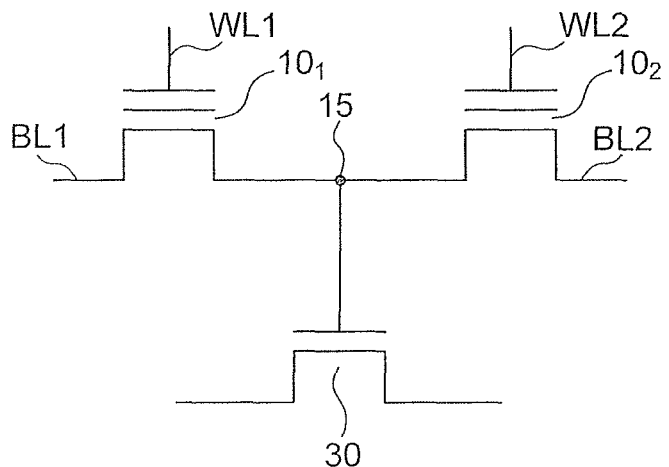
FIG. 18 is a circuit diagram showing a programmable logic switch of a first comparative example of the first embodiment.

A logic switch in a first comparative example according to the first embodiment is shown in FIG. 18. The logic switch in the first comparative example has a configuration obtained by eliminating the cutoff transistor 20 in the logic switch in the first example shown in FIG. 2. In other words, the logic switch in the first comparative example includes two memory transistors $10_1$ and $10_2$ and one pass transistor 30. The drain of the memory transistor $10_1$, the drain of the memory transistor $10_2$ and the gate of the pass transistor 30 are connected to a common node 15. In the logic switch in the comparative example, the power supply voltage is applied to one of the bit line BL1 and the bit line BL2 and 0 V is applied to the other of them, at the time of operation. The power supply voltage or 0 V is applied to the node 15 connected to the gate of the pass transistor 30 on the basis of information programmed for the memory transistors. As a result, on/off of the pass transistor 30 is changed over.

A method for writing data selectively into a memory transistor in the first comparative example will now be considered. For example, when conducting writing into the memory transistor $10_1$, i.e., when injecting electrons into the charge trap film, a positive write voltage is applied to the word line WL1. The write voltage is, for example, 20 V. At the same time, 0 V is applied to the bit line BL1 and the bit line BL2, and 0 V is applied to the word line WL2 as well. Thereupon, a channel is formed in the memory transistor $10_1$ by the positive voltage applied to the word line WL1, and the channel and the bit line BL1 are equal in potential and 0 V. Because of a great potential difference between the channel and the gate, electrons in the channel are injected into the charge trap film beyond the tunnel film by the FN tunnel current at this time. On the other hand, since the gate of the memory transistor $10_2$ is 0 V, writing into the memory transistor $10_2$ is not conducted.

If the logic switches in the first comparative example shown in FIG. 18 are arranged in an array form as cells, a plurality of memory transistors share a word line. For implementing selective writing into a memory, therefore, a technique for preventing writing by contriving conditions of voltages applied to bit lines even if a write voltage is applied to a word line is necessary. It is now supposed that the cell in the first comparison example shown in FIG. 18 is a cell where writing is not conducted, i.e., an unselected cell. For preventing writing into the memory transistor $10_1$ when a write voltage is applied to the word line WL1, a write inhibit voltage is applied to the bit line BL1. For example, if the memory write voltage is 20 V, the write inhibit voltage is approximately 5 V. At this time, a channel is formed in the memory transistor $10_1$ in the same way as the selected cell. Since the potential on the channel is 5 V, however, the potential difference between the channel and the gate is 15 V and thus injection of electrons does not occur.

In the write preventing method, however, the potential on the node 15 connected to the gate of the pass transistor 30 is equal to the potential on the bit line BL1, and it is, for example, 5 V. For obtaining a high speed logic switch, a high-performance transistor is demanded as the pass transistor. However, the gate insulation film of the high-performance transistor is as thin as several nm. If the write inhibit voltage is applied to the gate of the pass transistor, there is a fear that the gate insulation film will be broken down. In the logic switch in the first comparative example, therefore, the gate insulation film of the pass transistor need have a film thickness which is great enough to prevent breakdown caused by the write inhibit voltage. As a result, the speed of the logic switch falls.

Second Comparative Example

Figure 19:
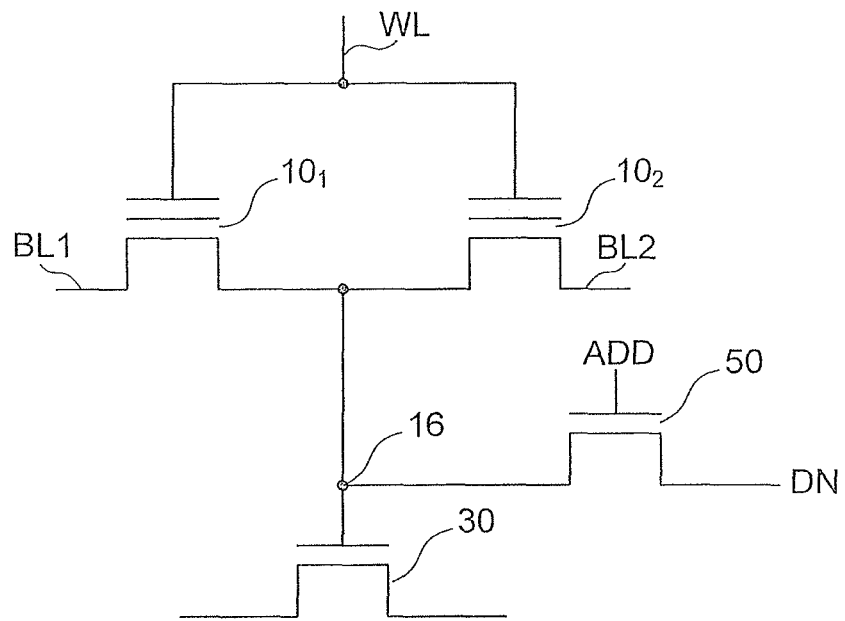
FIG. 19 is a circuit diagram showing a programmable logic switch of a second comparative example of the first embodiment.

A programmable logic switch according to a second comparative example is shown in FIG. 19. The logic switch according to the second comparative example has a configuration obtained by eliminating the cutoff transistor and providing an access transistor 50 in the logic switch according to the first example shown in FIG. 2. By the way, in the second comparative example, drains of the memory transistors $10_1$ and $10_2$, the gate of the pass transistor 30, and a drain of the access transistor 50 are connected to a common node 16. Furthermore, gates of both the memory transistors $10_1$ and $10_2$ are connected to a common word line WL.

In the logic switch in the second comparative example, the power supply voltage is applied to one of the bit line BL1 and the bit line BL2 and 0 V is applied to the other of the bit line BL1 and the bit line BL2, at the time of operation. The power supply voltage or 0 V is applied to the node 16 connected to the gate of the pass transistor 30 on the basis of information programmed for the memory transistors. As a result, on/off of the pass transistor 30 is changed over.

It is now supposed that data is to be written into a memory transistor selectively in the second comparative example shown in FIG. 19. For example, when conducting writing into the memory transistor $10_1$, a first write voltage is applied to the word line WL, a second write voltage is applied to the bit line BL1, and 0 V is applied to the bit line BL2. Furthermore, the access transistor is turned on, and then 0 V is applied to the access transistor 50 at its source. The first write voltage is, for example, 10 V and the second write voltage is, for example, 5 V. At this time, the memory transistor $10_1$ operates in the saturation region, and the channel pinch-off occurs on the bit line BL1 side. As a result, hot-electrons having high energy are generated. Writing is implemented by injecting the hot-electrons into the charge trap film in the memory transistor $10_1$ by means of the gate voltage. On the other hand, in the memory transistor $10_2$, there is no potential difference between the source/drain and consequently hot-electrons are not generated and thus writing does not occur.

In the second comparative example, writing using hot-electrons is adopted for the memory programming. As compared with the case where the FN current is used, however, writing using hot-electrons is disadvantageous in size shrinking of transistors in the channel direction. In particular, it is known that the generation efficiency of hot-electrons degrades if the gate length of a memory transistor becomes approximately 100 nm or less. For implementing memory writing using hot-electrons when the gate length is shrunk to, for example, 50 nm or less, therefore, it is necessary to strictly control the impurity profile in, for example, the channel or source/drain. Therefore, increase of the development cost is necessarily caused. In addition, it is considered that an operation error caused by dispersion on the process is apt to occur.

According to the first embodiment and its examples, selective memory writing is made possible and it is possible to prevent breakdown of the gate insulation film in the pass transistor at the time of writing and make the gate insulation film thin, as described heretofore. Furthermore, since the FN current can be used for writing into a memory, the chip size can be made small without degrading the write characteristics, i.e., without hampering the write efficiency.

Second Embodiment

Figure 20:
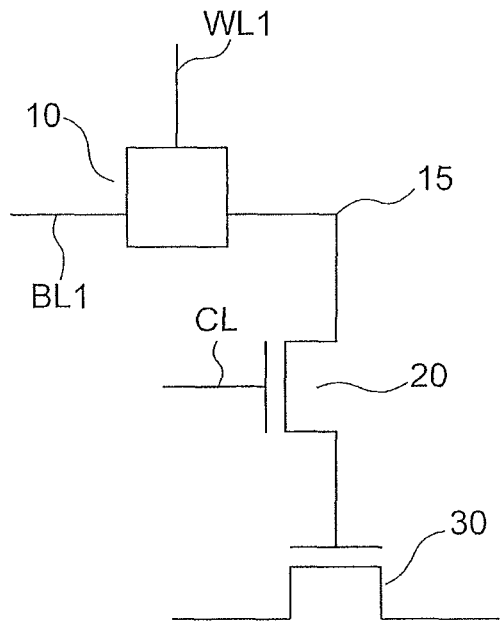
FIG. 20 is a circuit diagram showing a programmable logic switch according to a second embodiment.

A logic switch according to a second embodiment is shown in FIG. 20. The logic switch according to the second embodiment has a configuration obtained by eliminating one of the two memories $10_1$ and $10_2$ and leaving the other as memory transistor 10 in the logic switch according to the first embodiment shown in FIG. 1.

Even if the potential on the node 15 changes during all operations such as writing, erasing or other operations for the memory transistor 10, it is possible in the second embodiment to intercept the potential by the cutoff transistor 20 and prevent a high voltage from being applied to the gate of the pass transistor 30, in the same way as the first embodiment.

First Example

Figure 21:
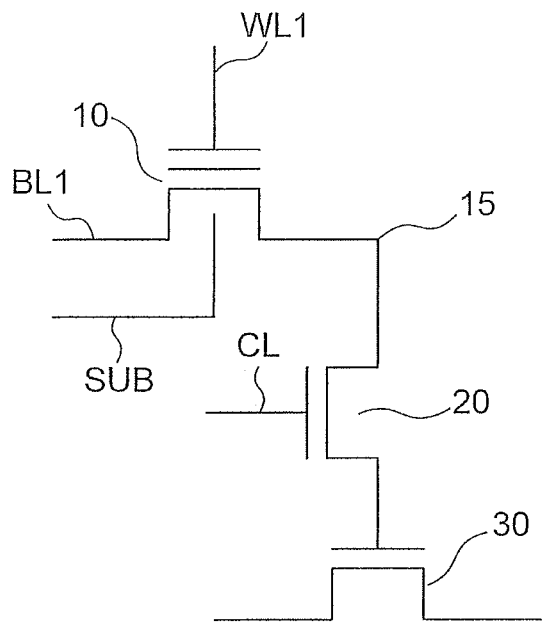
FIG. 21 is a circuit diagram showing a programmable logic switch according to a first example of the second embodiment.

A logic switch according to a first example which uses a flash memory transistor (referred to as memory transistor as well) as the memory transistor 10 in the second embodiment is shown in FIG. 21. The memory transistor 10 is formed in a well, and a terminal SUB for applying the substrate voltage is provided in the well.

Second Example

Figure 22:
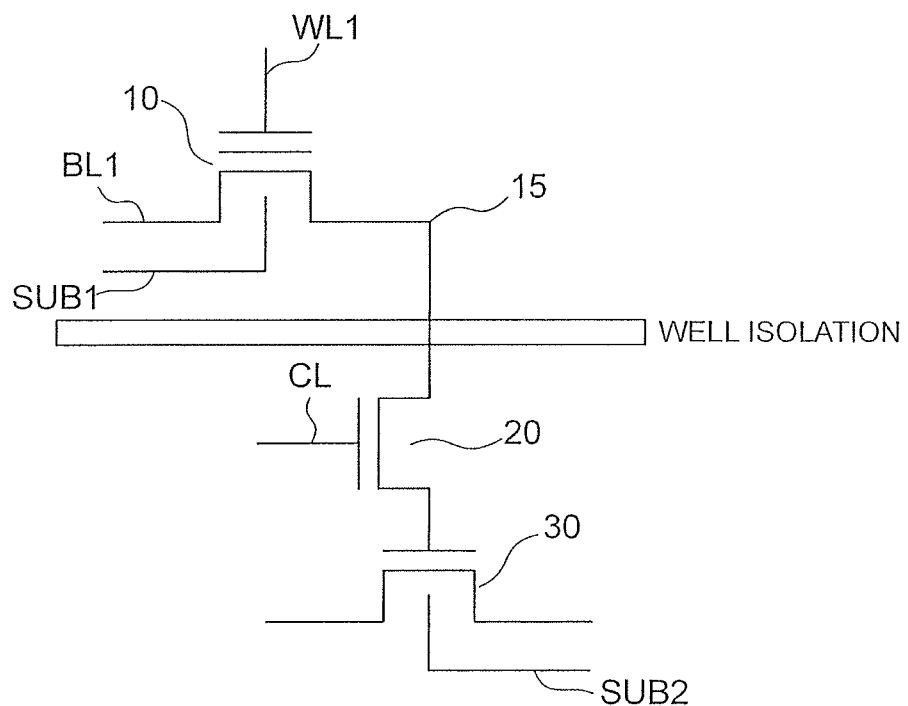
FIG. 22 is a circuit diagram showing a programmable logic switch according to a second example of the second embodiment.

A logic switch according to a second example is shown in FIG. 22. The logic switch according to the second example has a configuration obtained by forming the memory transistor 10, and the cutoff transistor 20 and the pass transistor 30 in different wells isolated by a device isolation region in the first example shown in FIG. 21. Therefore, a terminal SUB1 for applying a substrate bias is provided in a well in which the memory transistor 10 is formed, and a terminal SUB2 for applying a substrate bias is provided in a well in which the cutoff transistor 20 and the pass transistor 30 are formed. Owing to such a configuration, the substrate bias can be applied to the memory transistor 10 independently of the cutoff transistor 20 and the pass transistor 30.

(Write Method)

Figure 23:
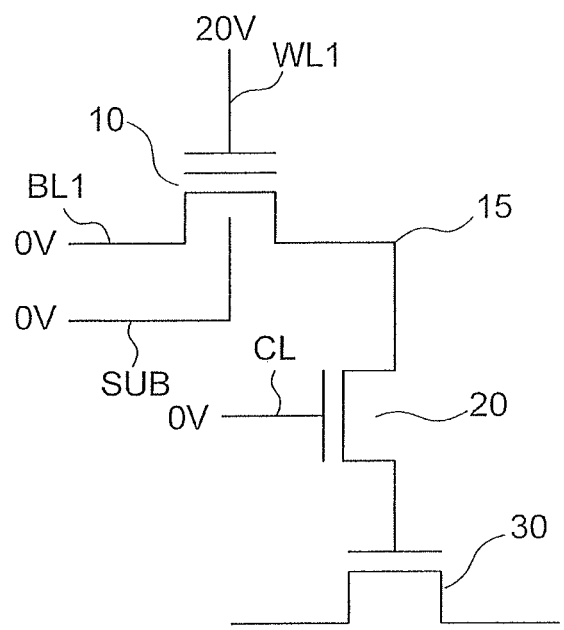
FIG. 23 is a diagram for explaining a write method for a memory in the second embodiment.

A program method (write method) of a memory in the logic switch according to the second embodiment will now be described with reference to FIG. 23. If it is desired to write data selectively into the memory transistor 10, a write voltage is applied to the word line WL1. The write voltage is, for example, 20 V. 0 V is applied to a word line connected to the gate of the memory transistor to be not written in. Furthermore, 0 V is applied to the bit line BL1. At this time, a channel is formed in the memory transistor 10 into which writing should be conducted selectively, and electrons are injected from the channel into the charge trap film by an FN current.

(Write Preventing Method)

Figure 24:
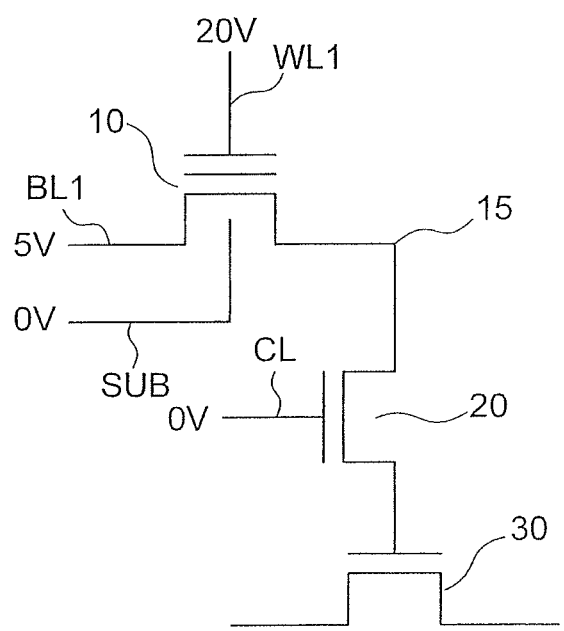
FIG. 24 is a diagram for explaining a write preventing method for a memory in the second embodiment.

In the case where a plurality of logic switches are arranged in an array, a plurality of memory transistors share a word line. If a write voltage 20 V is applied to a word line connected to the gate of a memory transistor to be written in, therefore, the 20 V is also applied to a gate of a memory transistor which is other than the memory transistor to be written in and which is connected to the word line, i.e., a gate of a memory transistor to be not written in. In order to implement selective writing, therefore, a write inhibit voltage of 5 V is applied to the bit line BL1 connected to the memory transistor 10 to be not written in as shown in FIG. 24 and consequently unexpected false error into a memory transistor to be not written in is prevented. In the memory transistor 10 to be not written in, the voltage of 20 V is applied to its gate and consequently a channel is formed. Since a potential on the channel is 5 V which is equal to the potential on the bit line BL1 and a potential difference between the channel and the gate is 15 V, however, writing error does not occur. At this time, the potential on the node 15 is also 5 V. If the cutoff transistor 20 is brought into the off-state by adjusting the potential on the control line CL connected to the gate of the cutoff transistor 20, however, 5 V is not applied to the gate of the pass transistor 30. In FIG. 24, the voltage applied to the control line CL is 0 V. However, the voltage applied to the control line CL may not be 0 V as long as it is lower than a threshold voltage of the cutoff transistor 20.

(Erase Method)

Figure 26:
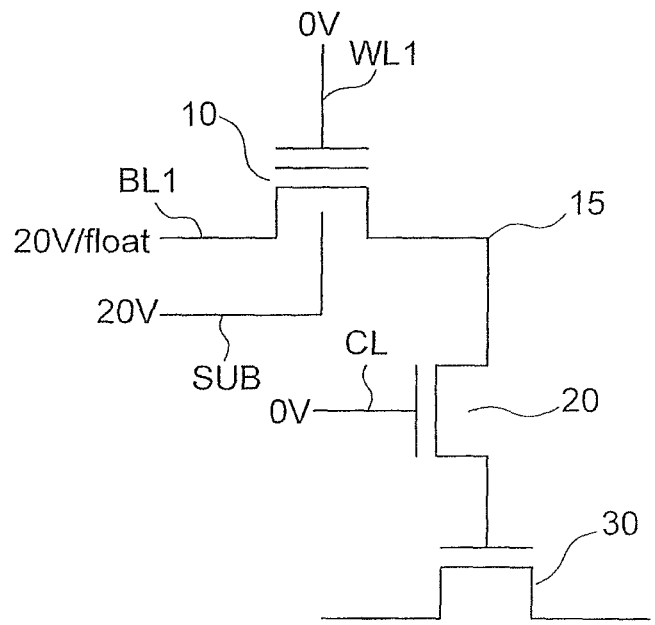
FIG. 26 is a diagram for explaining a second concrete example of an erase method for a memory in the second embodiment.
Figure 27:
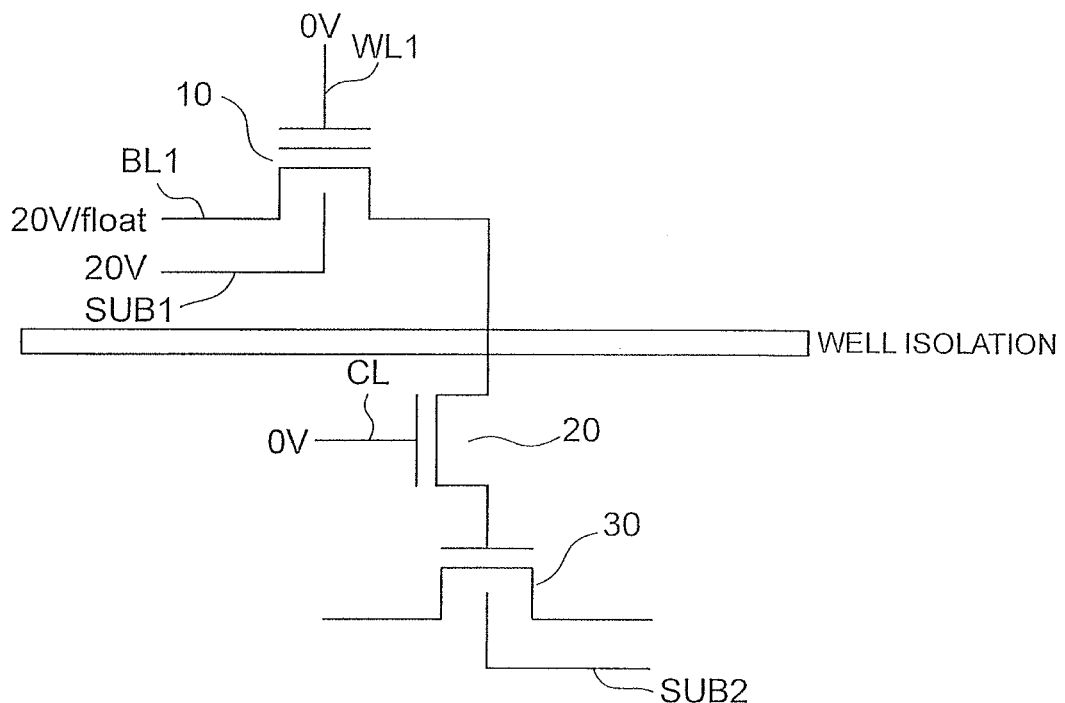
FIG. 27 is a diagram for explaining a third concrete example of an erase method for a memory in the second embodiment.

A method for erasing data in memories in the logic switch according to the second embodiment will now be described with reference to FIGS. 25 to 27.

Figure 25:
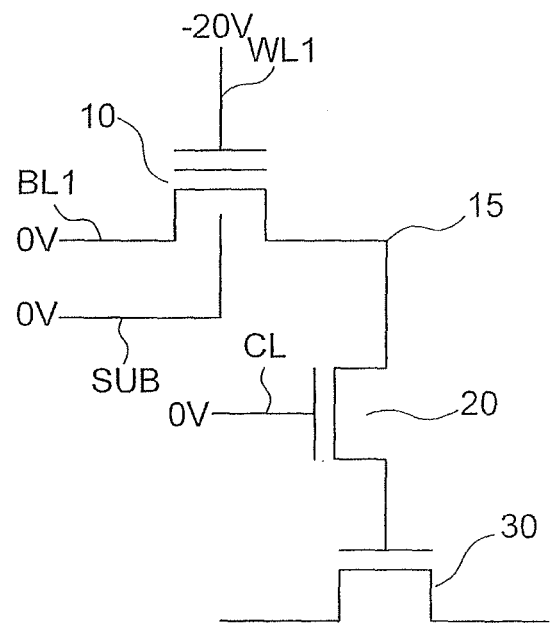
FIG. 25 is a diagram for explaining a first concrete example of an erase method for a memory in the second embodiment.

FIG. 25 shows a first concrete example of the erase method. An erase voltage is applied to the word line WL1 in a state in which 0 V is applied to the terminal SUB as the substrate bias and the potential on the bit line BL1 is made to be 0 V. At this time, the erase voltage is negative in sign and is, for example, −20 V. A second concrete example of the erase method is shown in FIG. 26. In the erase method of the second concrete example shown in FIG. 26, a positive erase voltage of, for example, 20 V is applied to the terminal SUB in a state in which the potential on the word line WL1 is brought to 0 V. At this time, the bit line BL1 should be kept in the floating state, or should be supplied with a voltage which is at least the voltage applied to the terminal SUB. In the case of the second concrete example shown in FIG. 26, a negative voltage is not necessary and consequently a power supply for negative voltage may not be provided and an advantage that the area can be made small is obtained. If the well for the memory transistor is common to the well for the pass transistor, however, the substrate bias is output from the pass transistor 30 via the source/drain of the pass transistor 30 by applying 20 V as the substrate bias. In general, it is considered that an output of the pass transistor 30 is connected to, for example, an input of an inverter. If the voltage of 20 V is applied to the input of the inverter, then a problem that gate breakdown of the transistor in the inverter might occur is posed. This problem can be solved by adopting a configuration capable of applying different substrate biases to the memory transistor 10 and the pass transistor 30 respectively, i.e., a configuration in a third example. If in this case, for example, the substrate bias of the pass transistor 30 is set equal to 0 V as indicated in an erase method of a third concrete example shown in FIG. 27, the problem can be solved.

On the other hand, in the erase method in the first concrete example shown in FIG. 25, the substrate bias applied to the terminal SUB is set equal to 0 V and consequently a high voltage is not output from the pass transistor 30. Furthermore, even if the potential on the node 15 is modulated in the negative direction by a negative voltage applied to the word line WL1, the substrate bias of 0 V is applied via the source/drain of the memory transistor 10, and the potential on the node 15 gets equal to 0 V swiftly.

(Operation of Logic Switch)

Figure 28:
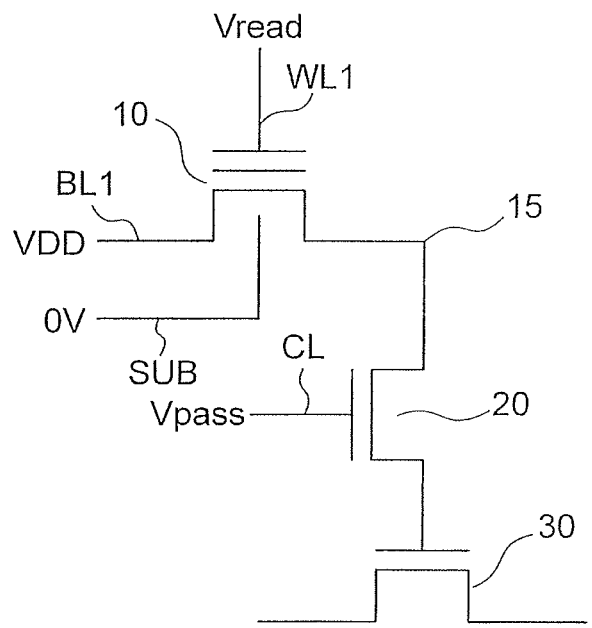
FIG. 28 is a diagram showing an example of a voltage applying condition in a case where a programmable logic switch according to the second embodiment is made to operate.

An example of a voltage applying condition in a case where the programmable logic switch is made to operate on the basis of information written into a memory is shown in FIG. 28. It is now supposed that the memory transistor 10 is programmed. A read voltage Vread is applied to the word line WL1. The read voltage Vread is an arbitrary voltage which is greater than a threshold voltage of the memory transistor 10 in the erase state and which is less than a threshold voltage of the memory transistor 10 in the write state. Furthermore, a voltage Vpass which is at least the threshold voltage of the cutoff transistor 20 is applied to the control line CL to electrically connect the gate of the pass transistor 30 to the node 15. The power supply voltage VDD is applied to the bit line BL1. In response to the program state of the memory transistor, the gate of the pass transistor 30 is connected to the power supply voltage VDD or brought into the floating state, and the pass transistor 30 is brought into the on-state or off-state.

In general, even if the power supply is cut off, data are not lost in the nonvolatile programmable logic switch. Therefore, it is possible to implement the power gating technique which reduces the power consumption of the whole chip by cutting off the power supply for regions which are not being used. In general, a transistor for signal interception is provided between the power supply and the memory transistors to prevent the power supply voltage from being applied to the memory transistor 10. In this case, however, additional transistors for cutting off the power supply are necessary.

In the second embodiment, it is possible to prevent the power supply voltage from being applied to the gate of the pass transistor 30 by turning off the cutoff transistor 20 in regions which are not being used. As a result, it is possible to exclude power consumption caused by a gate leakage current of the pass transistor 30 and it becomes possible to yield an effect equivalent to that of the power gating.

(Logic Switch Arranged in Array Form)

A concrete example in a case where the logic switches according to the second embodiment are arranged in an array form as cells will now be described with reference to FIGS. 29 and 30.

Figure 29:
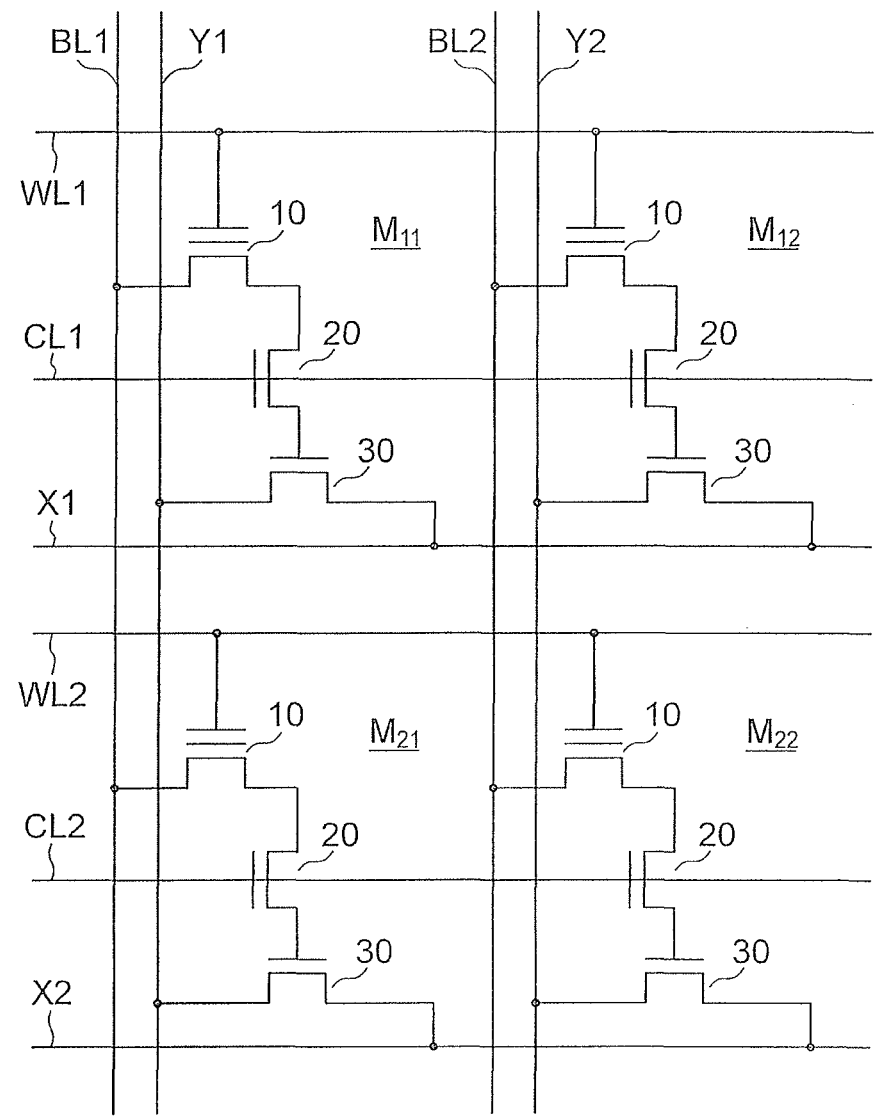
FIG. 29 is a diagram showing a first concrete example of a circuit in a case where logic switches according to the second embodiment are arranged in an array form as cells.
Figure 30:
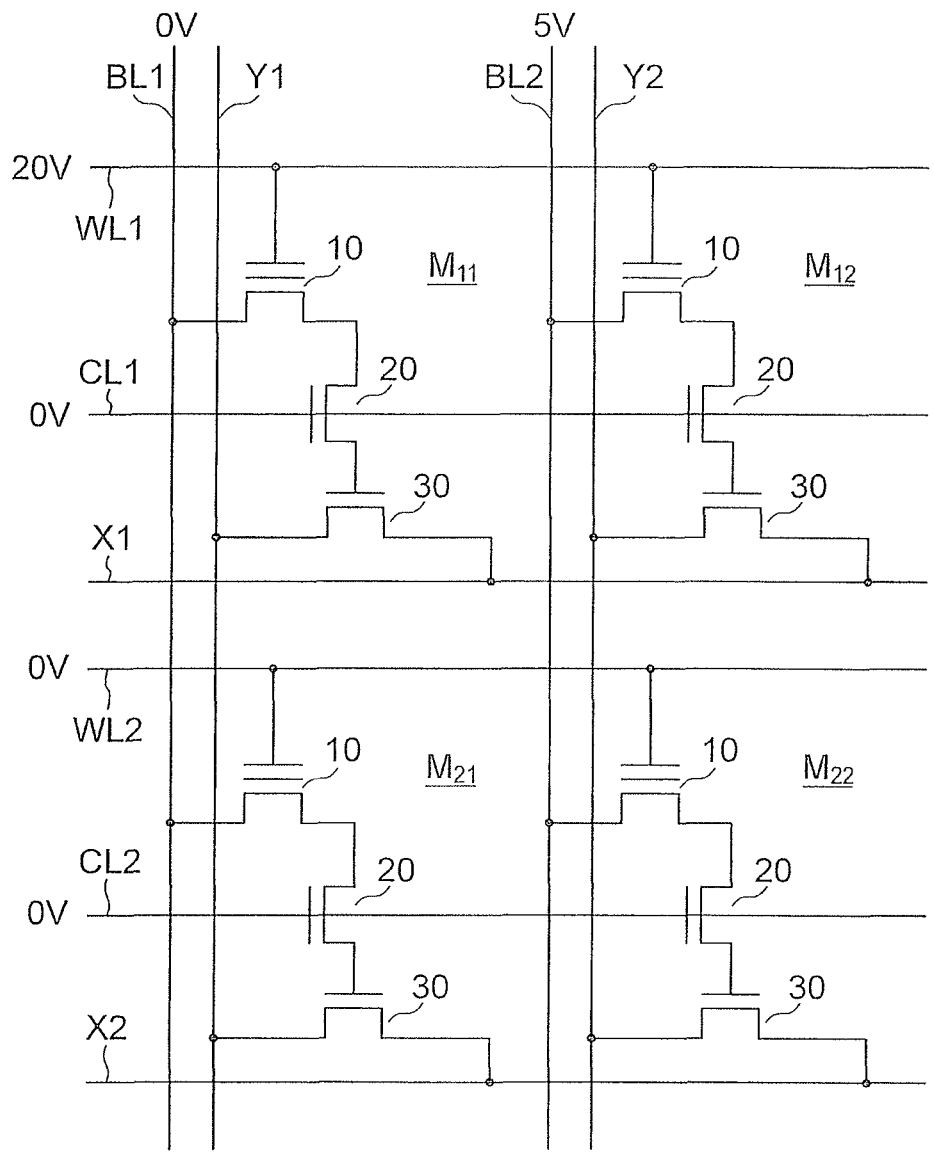
FIG. 30 is a diagram for explaining a write method in the circuit of the first concrete example shown in FIG. 29.

FIG. 29 is a circuit diagram showing a concrete example. A circuit in the concrete example shown in FIG. 29 includes cells $M_{ij}$ (i, j=1, 2) arranged in two rows by two columns, and each cell is, for example, the logic switch in the first example shown in FIG. 21.

In the cells $M_{11}$ and $M_{12}$ in a first row, the memory transistor 10 is connected at its gate to the word line WL1, and the cutoff transistor 20 is connected at its gate to a control line CL1.

In the cells $M_{21}$ and $M_{22}$ in a second row, the memory transistor 10 is connected at its gate to a word line WL2, and the cutoff transistor 20 is connected at its gate to a control line CL2.

In the cells $M_{11}$ and $M_{21}$ in a first column, the memory transistor 10 is connected at one of its source/drain to the bit line BL1. Furthermore, the path transistor 30 is connected at one of its source/drain to an interconnection Y1 disposed in the column direction, and connected at the other of its source/drain to an interconnection X1 or an interconnection X2 disposed in the row direction.

In the cells $M_{12}$ and $M_{22}$ in a second column, the memory transistor 10 is connected at one of its source/drain to the bit line BL2. Furthermore, the path transistor 30 is connected at one of its source/drain to an interconnection Y2 disposed in the column direction, and connected at the other of its source/drain to the interconnection X1 or the interconnection X2 disposed in the row direction.

Writing in the circuit in the concrete example having such a configuration will now be described with reference to FIG. 30. FIG. 30 is a diagram for explaining a write method used when conducting writing into the memory transistor 10 connected to the word line WL1 and the bit line BL1 in the circuit of the concrete example. Among the bit lines BL1 and BL2, 0 V is applied to the bit line BL1 connected to the memory transistor to be written in, whereas the write inhibit voltage is applied to the other bit line BL2. Writing is conducted by using the method described in the second embodiment.

Figure 31:
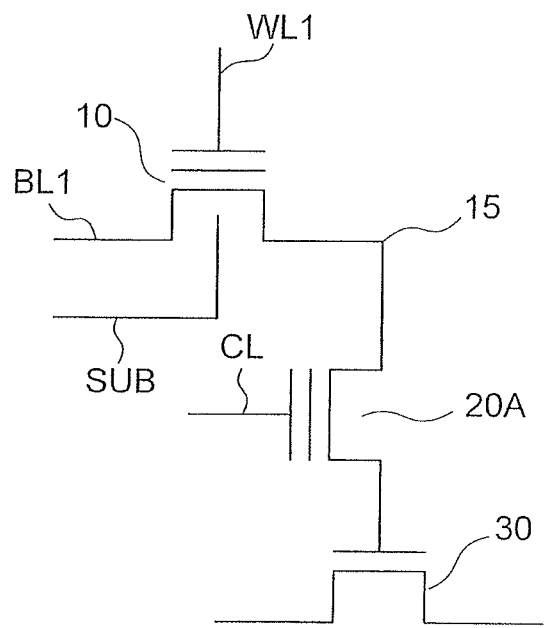
FIG. 31 is a circuit diagram showing a programmable logic switch according to a third example of the second embodiment.

A logic switch according to a third example in the second embodiment is shown in FIG. 31. The logic switch according to the third example has a configuration obtained by replacing the cutoff transistor 20 with a flash memory transistor 20A in the logic switch in the first example shown in FIG. 21. As a result, a gate stack of the memory transistor 10 and a gate stack of the cutoff transistor 20A can be fabricated in the same process. Therefore, it becomes possible to reduce the cost because of the process simplification.

In the second embodiment as well, requirements for the cutoff transistor are the same as those in the case of the first embodiment.

According to the second embodiment and its examples as well, selective memory writing is made possible and it is possible to prevent breakdown of the gate insulation film in the pass transistor at the time of writing and make the gate insulation film thin, in the same way as the first embodiment. Furthermore, since the FN current can be used for writing into a memory, the chip size can be made small without degrading the write characteristics, i.e., without hampering the write efficiency.

Third Embodiment

Figure 32:
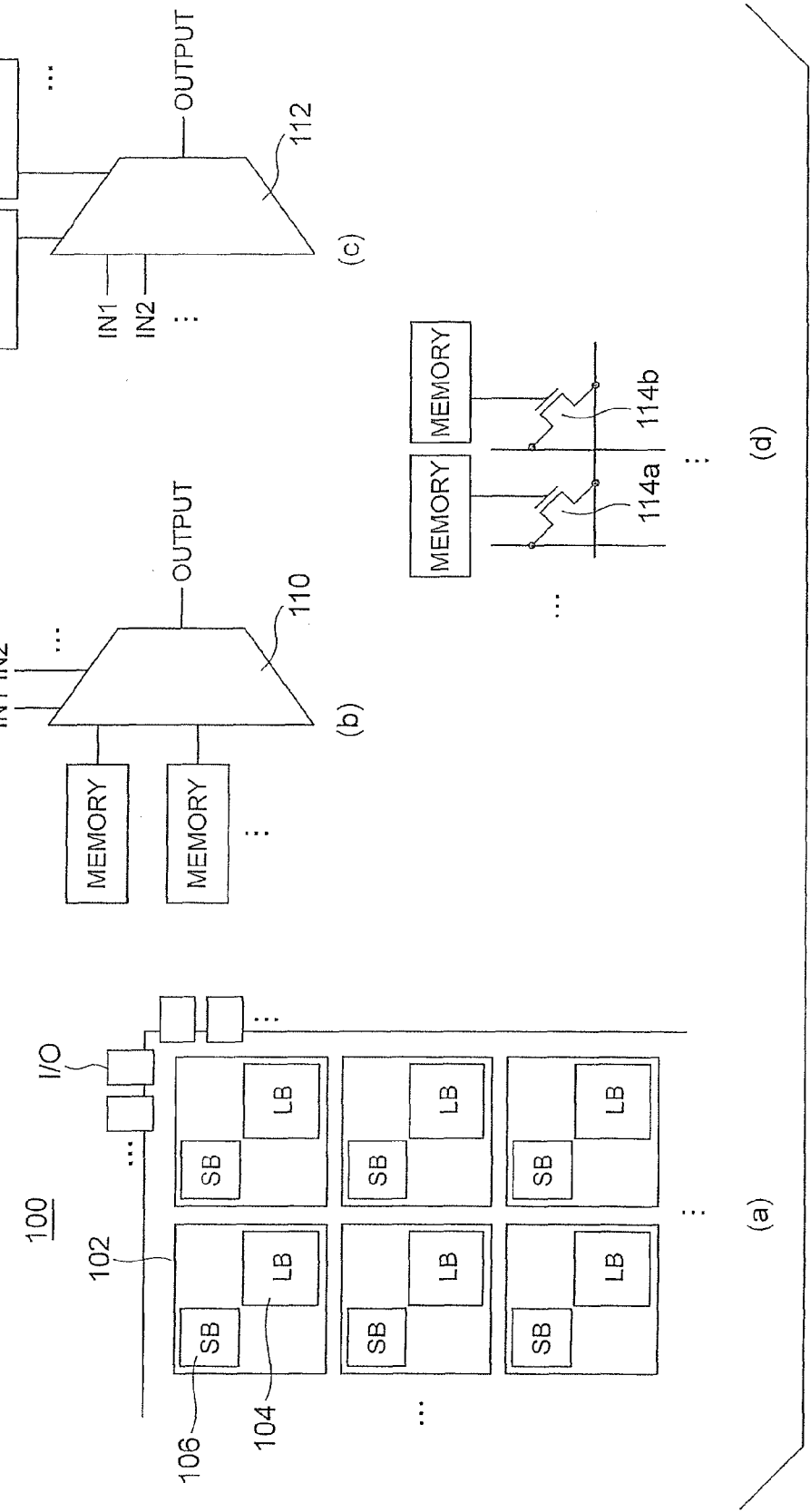
FIGS. 32(a) to 32(d) are block diagrams showing an FPGA according to a third embodiment.

An FPGA according to a third embodiment will be described with reference to FIGS. 32(a) to 32(d). FIG. 32(a) shows an FPGA 100 of this embodiment, which includes a plurality of basic tiles 102 arranged in an array form, and input and output units I/O arranged around the array of the basic tiles 102. Each of the basic tiles 102 includes a logic block (hereinafter also referred to as "LB") 104 and a switch block (hereinafter also referred to as "SB") 106. Each logic block 104 has a multiplexer 110 or 112 as shown in FIG. 32(b) or 32(c), to achieve a logical function. The multiplexer 110 shown in FIG. 32(b) selects, as its output signal, at least one of output signals from a plurality of memories based on input signals IN1, IN2, . . . . The multiplexer 112 shown in FIG. 32(c) selects, as its output signal, at least one of input signals IN1, IN2, . . . based on signals from memories. As shown in FIG. 32(d), the switch block 106 has a plurality of switches 114a, 114b each turning on/off based on information stored in a memory, and has a function of changing the combination of the wiring connection using the switches. Thus, the logic block 104 and the switch block 106 each have memories for storing information. By rewriting the information stored in these memories, the entire FPGA achieved a desired logic. Information to be stored in the memories is externally inputted by means of the input and output units I/O. As the multiplexer and the memories in the logic block 104, the programmable logic switches of the first and the second embodiments are used, and as the switches and the memories of the switch block 106, the programmable logic switches of the first and the second embodiments are used.

As in the cases of the first and the second embodiments, the FPGA of the third embodiment thus configured prevents the breakage of the gate insulating film of the pass transistor during the selective writing of memories, and makes it possible to reduce the thickness of the gate insulating film of the pass transistor. Furthermore, it is possible to obtain an FPGA, in which the write efficiency is not impaired by miniaturizing memories.

While certain embodiments have been described, these embodiments have been presented by way of example only, and are not intended to limit the scope of the inventions.

Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

The invention claimed is:

1. A nonvolatile programmable logic switch comprising first and second cells, each of the first and second cells comprising:
a first memory having a first terminal, a second terminal, and a third terminal which receives a control signal to control a memory state, the first memory being a first memory transistor having a gate structure formed by stacking a first insulation film, a charge trap film, a second insulation film, and a gate electrode, a source and a drain of the first memory transistor being the first and second terminal, and the gate electrode being the third terminal;
a first transistor connected at one of source/drain thereof to the second terminal; and
a second transistor connected at a gate thereof to the other of the source/drain of the first transistor,
the third terminal of the first memory in the first cell and the third terminal of the first memory in the second cell being connected in common, and
when conducting writing into the first memory in the first cell, the third terminals being connected to a write power supply which generates a write voltage, the first terminal of the first memory in the first cell being connected to a ground power supply which generates a ground voltage, and the first terminal of the first memory in the second cell being connected to a write inhibit power supply which generates a write inhibit voltage, the write inhibit voltage being between the ground voltage and the write voltage.

2. The switch according to claim 1, wherein denoting a total sum of film thicknesses of an insulation film in the gate structure of the first memory transistor by $T_M$, a total sum $T_C$ of film thicknesses of an insulation film in a gate structure of the first transistor satisfies a relation $$T_C \geq T_M/4.$$

3. The switch according to claim 1, wherein denoting a total sum of film thicknesses of an insulation film in the gate structure of the first memory transistor by $T_M$, a total sum $T_C$ of film thicknesses of an insulation film in a gate structure of the first transistor satisfies a relation $$T_C \geq T_M/2.$$

4. The switch according to claim 1, wherein denoting a total sum of film thicknesses of an insulation film in the gate structure of the first memory transistor by $T_M$, a dielectric constant of silicon by $\in_S$, and an elementary electric charge by q, an impurity concentration $N_{CH}$ in a channel in the first transistor satisfies a relation $$N_{CH} \leq 2 \times \in_S/(5 \times q \times T_M).$$

5. The switch according to claim 1, wherein denoting an impurity concentration in a channel in the first transistor by $N_{CH}$, a maximum impurity concentration $N_S$ in the source/drain of the first transistor connected to the second terminal satisfies a relation $$N_{CH} < N_S < N_{CH} \times 100.$$

6. The switch according to claim 1, wherein a maximum impurity concentration in the source/drain of the first transistor connected to the gate of the second transistor is greater than a maximum impurity concentration in the source/drain of the first transistor connected to the second terminal.

7. The switch according to claim 1, wherein denoting an impurity concentration in a channel in the first transistor by $N_{CH}$, a maximum impurity concentration in the source/drain of the first transistor connected to the second terminal by $N_S$, a dielectric constant of silicon by $\in_S$, and an elementary electric charge by q, a gate length $L_G$ of the first transistor satisfies a relation $$L_G > ((17 \times \in_S \times (N_{CH} + N_S)/(q \times N_{CH} \times N_S))^{1/2}.$$

8. The switch according to claim 1, wherein
the first memory transistor is formed in a first well,
the first transistor and the second transistor are formed in a second well different from the first well, and
each of the first and second wells comprises an electrode to apply a substrate bias.

9. The switch according to claim 1, wherein
each of the first and second cells comprises a second memory, and
the second memory comprises a fourth terminal, a fifth terminal connected to the second terminal, and a sixth terminal which receives a control signal to control a memory state, the second memory being a second memory transistor having a gate structure formed by stacking a first insulation film, a charge trap film, a second insulation film, and a gate electrode, a source and a drain of the second memory transistor being the fourth and fifth terminal, and the gate electrode being the sixth terminal,
the sixth terminal of the second memory in the first cell and the sixth terminal of the second memory in the second cell being connected in common.

10. The switch according to claim 9, wherein
the first and second memory transistors are formed in a first well,
the first transistor and the second transistor are formed in a second well different from the first well, and
each of the first and second wells comprises an electrode to apply a substrate bias.

11. The switch according to claim 1, wherein the first transistor is a memory transistor having a gate structure formed by stacking a first insulation film, a charge trap film, a second insulation film, and a gate electrode.

12. The switch according to claim 1, wherein the charge trap film of the first memory transistor is a film including silicon nitride.

13. The switch according to claim 9, wherein the charge trap film of each of the first and second memory transistors is a film including silicon nitride.

14. The switch according to claim 1, wherein the first memory transistor, the first transistor and the second transistor are formed in a first well in which an electrode for applying substrate bias is formed.

15. The switch according to claim 14, wherein when conducting erasing into the first memory transistor in the first cell, the third terminals are connected to an erase power supply which generates a negative erase voltage, and the first well is connected to a ground power supply.

16. The switch according to claim 8, wherein when conducting erasing into the first memory transistor in the first cell, the third terminals are connected to a ground power supply, and the first well is connected to an erase power supply which generates a positive erase voltage.

17. The switch according to claim 1, wherein when controlling on/off of the second transistor, after the first memory is set to be a writing state or an erasing state, the first terminal is connected to a first power supply which generates a first power supply voltage, and a gate of the first transistor is connected to a first control power supply which generates a control supply voltage.

18. The switch according to claim 9, wherein when controlling on/off of the second transistor, after the first memory is set to be a writing state and the second memory is set to be an erasing state, one of the first and fourth terminals is connected to a first power supply which generates a first power supply voltage, the other of the first and fourth terminals is connected to a ground power supply, and a gate of the first transistor is connected to a first control power supply which generates a control supply voltage.

19. A nonvolatile programmable logic device comprising a plurality of wirings and a connection unit configured to switch connection/disconnection of the wirings, the connection unit comprising one or more programmable logic switches,
each programmable logic switch comprising first and second cells,
each of the first and second cells comprising:
a first memory having a first terminal, a second terminal, and a third terminal which receives a control signal to control a memory state, the first memory being a first memory transistor having a gate structure formed by stacking a first insulation film, a charge trap film, a second insulation film, and a gate electrode, a source and a drain of the first memory transistor being the first and second terminal, and the gate electrode being the third terminal;
a first transistor connected at one of source/drain thereof to the second terminal; and
a second transistor connected at a gate thereof to the other of the source/drain of the first transistor,
the third terminal of the first memory in the first cell and the third terminal of the first memory in the second cell being connected in common, and
when conducting writing into the first memory in the first cell, the third terminals being connected to a write power supply which generates a write voltage, the first terminal of the first memory in the first cell being connected to a ground power supply which generates a ground voltage, and the first terminal of the first memory in the second cell being connected to a write inhibit power supply which generates a write inhibit voltage, the write inhibit voltage being between the ground voltage and the write voltage.

20. A nonvolatile programmable logic device comprising a plurality of wirings and a connection unit configured to switch connection/disconnection of the wirings, the connection unit comprising one or more programmable logic switches,
each programmable logic switch comprising first and second cells,
each of the first and second cells comprising:
a first memory having a first terminal, a second terminal, and a third terminal which receives a control signal to control a memory state, the first memory being a first memory transistor having a gate structure formed by stacking a first insulation film, a charge trap film, a second insulation film, and a gate electrode, a source and a drain of the first memory transistor being the first and second terminal, and the gate electrode being the third terminal;
a first transistor connected at one of source/drain thereof to the second terminal;
a second transistor connected at a gate thereof to the other of the source/drain of the first transistor; and
a second memory, having a fourth terminal, a fifth terminal connected to the second terminal, and a sixth terminal which receives a control signal to control a memory state, the second memory being a second memory transistor having a gate structure formed by stacking a first insulation film, a charge trap film, a second insulation film, and a gate electrode, a source and a drain of the second memory transistor being the fourth and fifth terminal, and the gate electrode being the sixth terminal,
the third terminal of the first memory in the first cell and the third terminal of the first memory in the second cell being connected in common, the sixth terminal of the second memory in the first cell and the sixth terminal of the second memory in the second cell being connected in common, and
when conducting writing into the first memory in the first cell, the third terminals being connected to a write power supply which generates a write voltage, the first terminal of the first memory in the first cell being connected to a ground power supply which generates a ground voltage, and the first terminal of the first memory in the second cell being connected to a write inhibit power supply which generates a write inhibit voltage, the write inhibit voltage being between the ground voltage and the write voltage.

21. The switch according to claim 1, wherein the first memory transistor is a floating gate transistor.

22. The switch according to claim 1, wherein the first memory transistor is a metal-oxide-nitride-oxide-semiconductor transistor.

* * * * *